(12) United States Patent
Wachi

(10) Patent No.: US 6,928,632 B2
(45) Date of Patent: Aug. 9, 2005

(54) METHOD OF DESIGNING SEMICONDUCTOR DEVICE USING POWER SUPPLY BUMP CONNECTIONS

(75) Inventor: Yuji Wachi, Tokyo (JP)

(73) Assignee: Renesas Technology Corp., Tokyo (JP)

(*) Notice: Subject to any disclaimer, the term of this patent is extended or adjusted under 35 U.S.C. 154(b) by 34 days.

(21) Appl. No.: 10/175,001

(22) Filed: Jun. 20, 2002

(65) Prior Publication Data
US 2003/0097641 A1 May 22, 2003

(30) Foreign Application Priority Data
Nov. 19, 2001 (JP) .................................... 2001-353061

(51) Int. Cl.⁷ .............................................. G06F 17/50
(52) U.S. Cl. ................................. 716/14; 716/1; 716/9; 716/11; 716/19
(58) Field of Search ........................... 716/1, 9, 11, 14, 716/19, 2, 20, 7, 10, 12; 361/820; 365/226, 233

(56) References Cited

U.S. PATENT DOCUMENTS

| | | | | |
|---|---|---|---|---|
| 6,034,912 A | * | 3/2000 | Isomura et al. | 365/233 |
| 2002/0031032 A1 | * | 3/2002 | Ooishi | 365/226 |
| 2002/0141171 A1 | * | 10/2002 | Bohr | 361/820 |

FOREIGN PATENT DOCUMENTS

JP 405152302 A * 6/1993

* cited by examiner

Primary Examiner—Thuan Do
(74) Attorney, Agent, or Firm—Oblon, Spivak, McClelland, Maier & Neustadt, P.C.

(57) ABSTRACT

Provided is a method of designing a semiconductor device in which power supply voltages can be applied individually and clock jitter is suppressed to avoid lowering of logic operation rate. Specifically, plural power supply lines (WL1) electrically connected to power supply bumps (BP1, BP2) are disposed in parallel to the lateral array of the power supply bumps (BP1, BP2), and power supply lines (WL2) of the lower layer which are electrically connected to the power supply lines (WL1) are disposed in parallel to each other so as to be orthogonal to the power supply lines (WL1) when viewed from above. Power supply voltages (V1, V2) are assigned to two power supply lines (WL1) that are nearest neighbors across an array of the power supply bumps (BP1), and power supply voltages (G1, G2) are assigned to two power supply lines (WL1) that are nearest neighbors across an array of the power supply bumps (BP2). The power supply lines (WL2) are disposed in parallel to each other so as to be orthogonal to the power supply lines (WL1) when viewed from above.

13 Claims, 18 Drawing Sheets

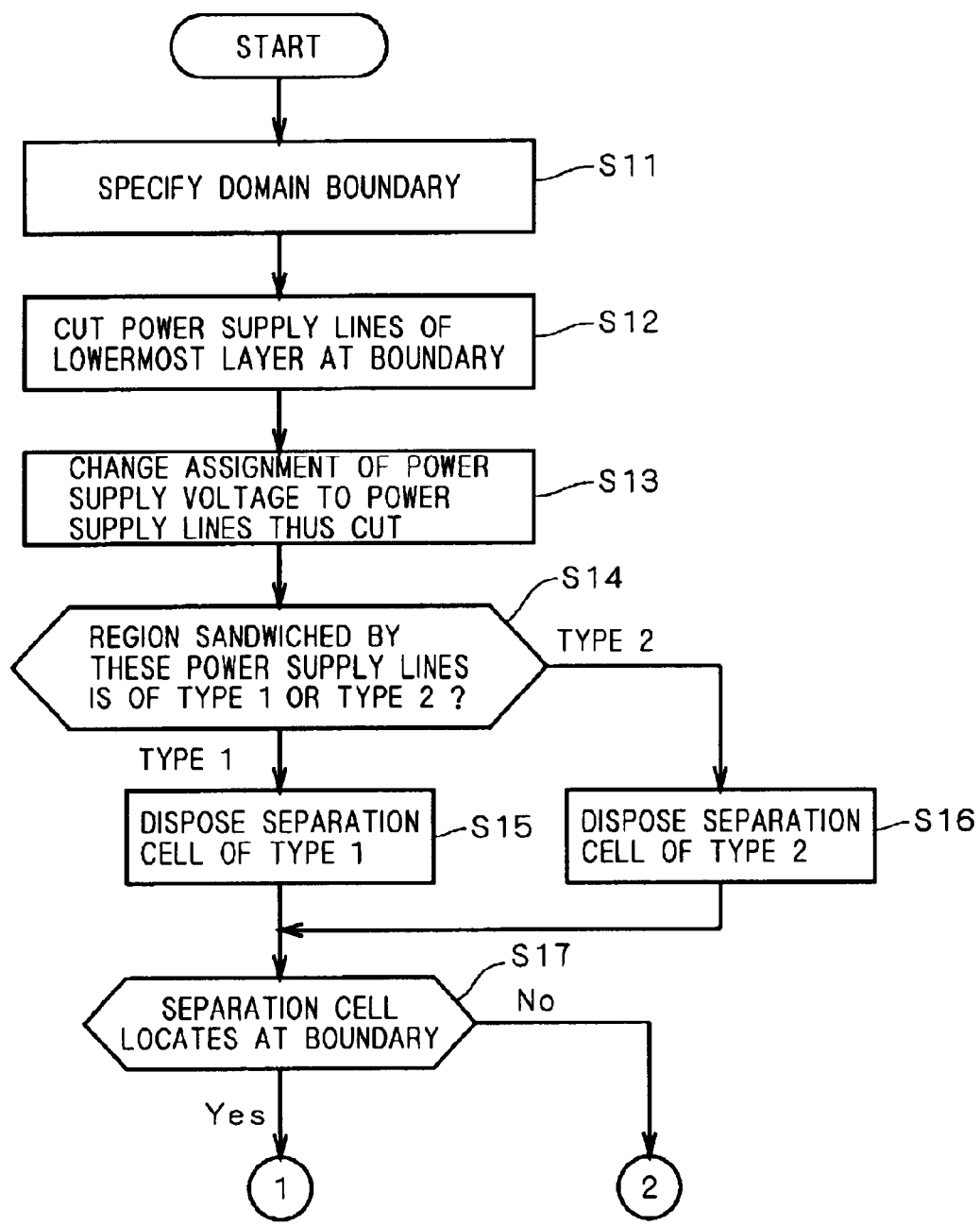

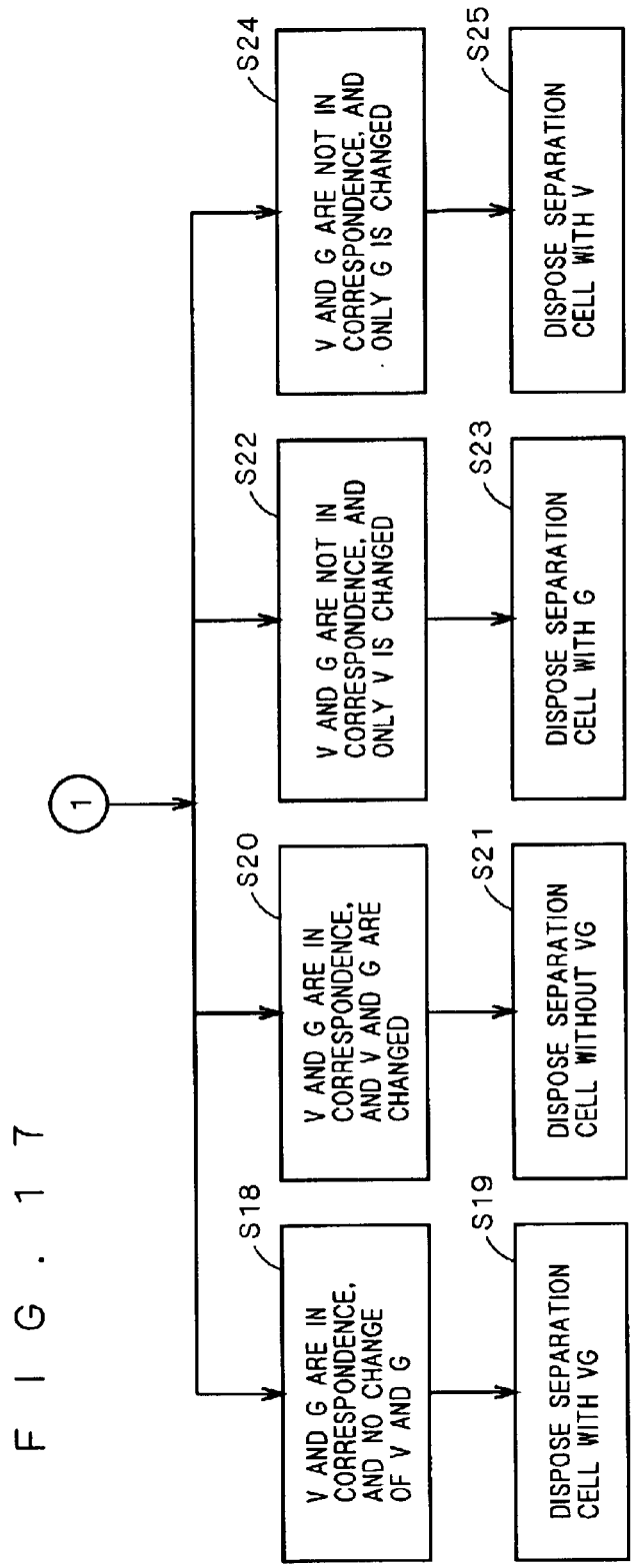

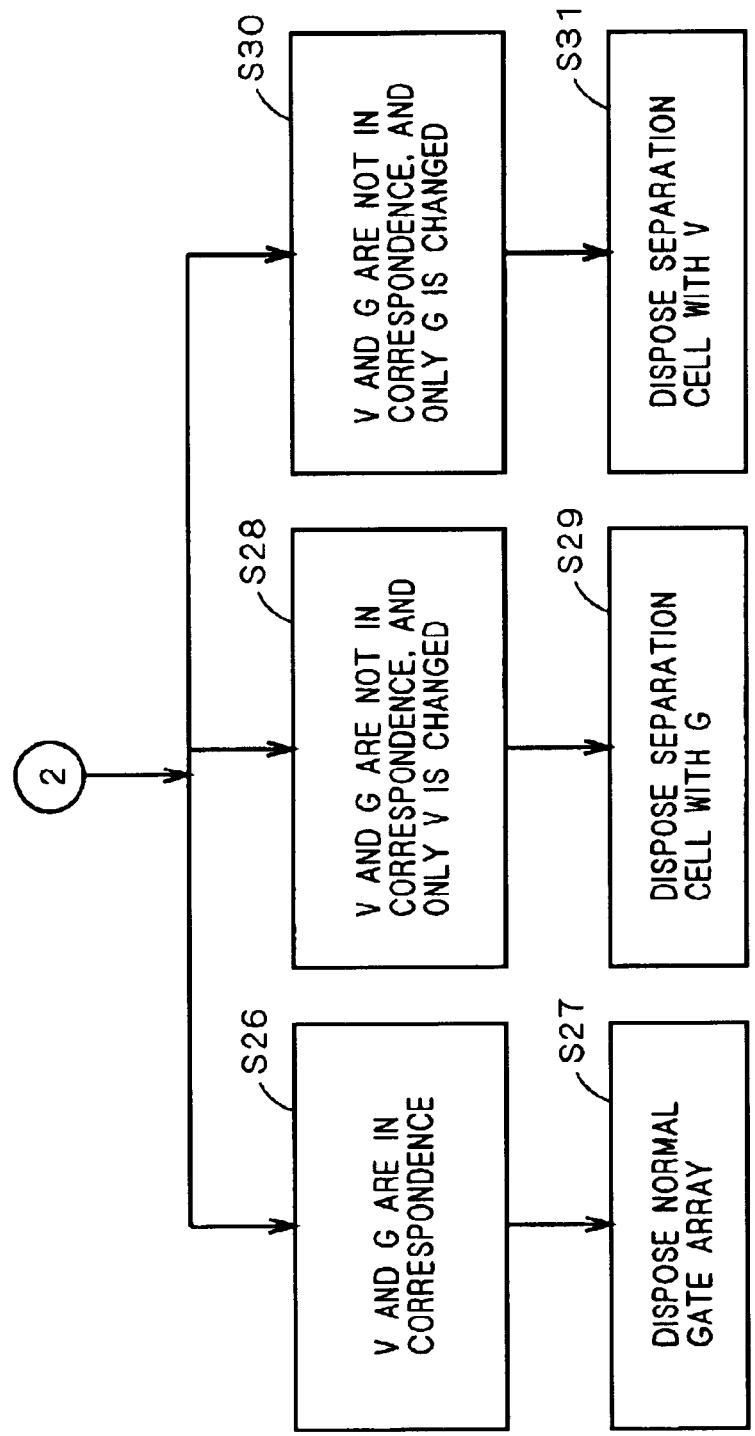

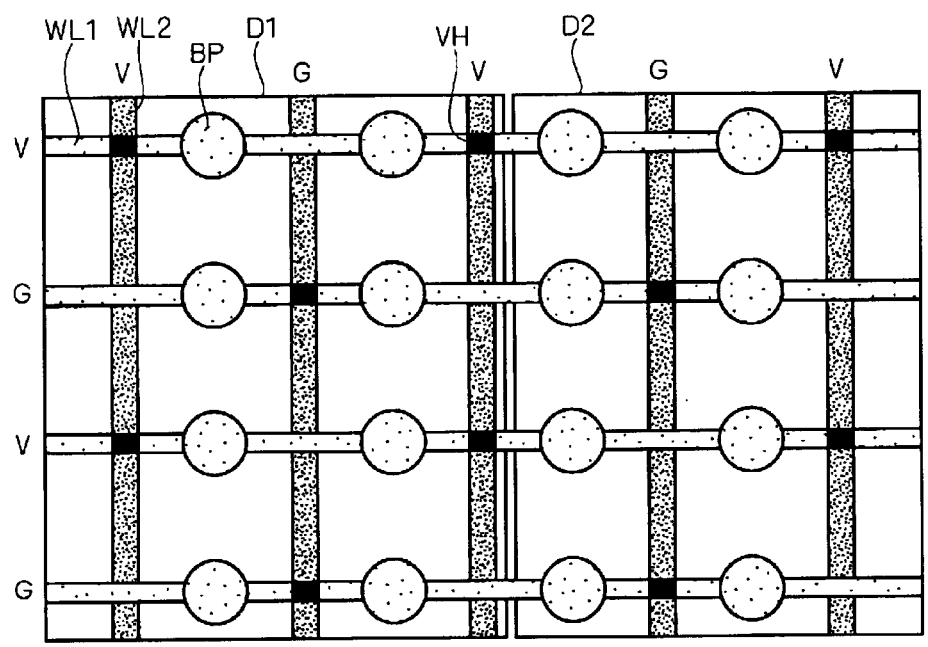
F I G . 1 9 (BACKGROUND ART)

F I G . 2 0 (BACKGROUND ART)
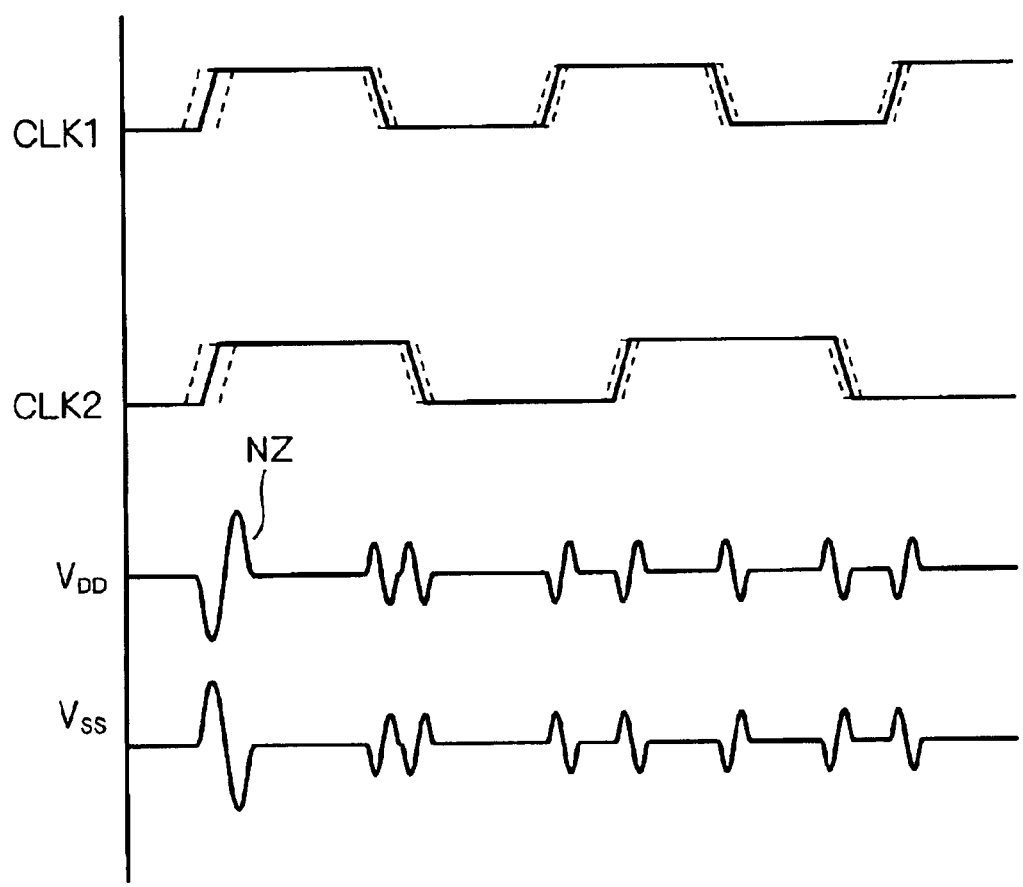

METHOD OF DESIGNING SEMICONDUCTOR DEVICE USING POWER SUPPLY BUMP CONNECTIONS

BACKGROUND OF THE INVENTION

1. Field of the Invention

The present invention relates to a method of designing a semiconductor device and, in particular, to a method of assigning power supply voltage of a semiconductor device in which plural types of clocks are applied to a logic region.

2. Description of the Background Art

Referring to FIG. 19, a conventional method of assigning power supply voltage will be described. In the configuration of FIG. 19, a logic region on a semiconductor substrate is divided into two regions of domains D1 and D2, and clocks CK1 and CK2 having different frequencies are provided to the domains D1 and D2, respectively.

From a data output of a flip flop that operates using a rise edge of clock as a trigger, data is applied to logic gates to be formed in the domains D1 and D2, and the data is then transferred in the sequence in which the logic gates are connected.

In the domains D1 and D2, the power supply for operation is provided from a power supply source that is called "power supply bump." FIG. 19 shows the state that a plurality of power supply bumps BP are disposed in a matrix in the domains D1 and D2, respectively.

An individual power supply bump BP is connected to a metal power supply line WL1 that extends linearly across the domains D1 and D2. A plurality of power supply lines WL1 are disposed in parallel. A plurality of power supply bumps BP are directly connected to a single power supply line WL1. The same power supply voltage is applied from the exterior to these power supply bumps BP. For instance, a power supply voltage V is applied (assigned) to the uppermost power supply line WL1 in FIG. 19, and a power supply voltage G is applied (assigned) to the next lower power supply line WL1, thus repeating the sequence of assignment. For instance, a drain power supply voltage $V_{DD}$ and a source power supply voltage $V_{SS}$ in a MOS transistor are applied as power supply voltages V and G, respectively.

In the layer underlying the power supply lines WL1, a plurality of power supply lines WL2, which are orthogonal to the power supply lines WL1 when viewed from above, are disposed in parallel. An interlayer insulating film electrically insulates the power supply lines WL1 and WL2. In portions at which both of the power supply lines cross when viewed from above, a via hole is formed by etching etc., such that it penetrates through the interlayer insulating film. The power supply lines WL1 and WL2 are electrically connected to each other by via contacts VH that are obtained by filling the via hole with a conductive material. Therefore, the voltage of the power supply line WL1 is to be applied (assigned) to the power supply line WL2 that is electrically connected to the power supply line WL1 through the via contacts VH.

A ground voltage (0 V) is applied to a half of the plural power supply lines WL1 and WL2. That is, no voltage is substantially applied thereto, however, such lines are also referred to as a "power supply line."

The leftmost power supply line WL2, as viewed in FIG. 19, is electrically connected to the power supply line WL1 applying a power supply voltage V, so that the voltage V is applied to the line WL2. The second power supply line WL2 from the left is electrically connected to the power supply line WL1 applying a power supply voltage G, so that the voltage G is applied to the line WL2. Thus, the sequence of electrical connection is repeated.

The power supply lines WL2 to which a power supply voltage V is applied, and the power supply lines WL2 to which a power supply voltage G is applied, are electrically connected to the power supply lines of the lowermost layer that provide power source to a gate array constructed on the semiconductor substrate. The power supply voltages V and G are applied from the power supply lines WL2 to the source/drain layer of the gate array.

Thus, in the conventional method of assigning power supply voltage, the power supply lines WL1 to which a power supply voltage V or G is applied are disposed so as to extend across the domains D1 and D2 to which the clocks CK1 and CK2 having different frequencies are provided. Thereby, the voltage V and G are also applied to the domains D1 and D2, respectively.

The problem is power supply noise caused by a frequency difference between the clocks CK1 and CK2. As stated above, from the data output of the flip flop that operates using the rise edge of clock as a trigger, data is provided to logic gates to be formed in the domains D1 and D2. There are a large number of combinations of such logic gate and flip flop in the domains D1 and D2.

Since many of the plural flip flops operate in synchronization with each other, the maximum power is consumed at the timing of clock rises. At that time, current flows on the power supply lines WL1, WL2, and power supply bumps BP, which current causes variations in power supply voltage value. This is power supply noise.

The relationship between the timing of the clocks CK1 and CK2, as well as the power supply noise will be described with reference to FIG. 20, showing a timing chart of the clocks CK1, CK2, and variations in power supply voltages $V_{DD}$ and $V_{SS}$.

As shown in FIG. 20, the clocks CK1 and CK2 differ from one another in frequency, and their clock rise edges are basically asynchronous. Accordingly, the temporal variations of power supply voltage $V_{DD}$ occur in response to the pulse rise and fall of the clocks CK1 and CK2. The variations of power supply voltage $V_{DD}$ is power supply noise NZ. Needless to say, a similar noise occurs in power supply voltage $V_{SS}$.

Unless the timing of occurrence of power supply noise NZ is synchronous, the interaction of power supply noises will occur. This increases the influence on the operation rate of the logic gates than if a single clock is applied.

In the foregoing, it is described that the clock rise edges are basically asynchronous when the clocks CK1 and CK2 have different frequencies. However, if the clocks CK1 and CK2 are of multiple frequencies, their rise edges will coincide somewhere.

Referring to FIG. 20, the rise edge of the initial pulse of the clock CK1 is synchronized with that of the clock CK2. At this time, a plurality of flip flops operate simultaneously in both of the domains D1 and D2, and a peak value of power supply noise NZ is increased than if the flip flops operate in each domain. In FIG. 20, there is shown in such a way that the power supply noise NZ oscillates. This is because the inductance accompanied by the power supply line of a clock driver produces the counter electromotive force in an opposed direction relative to the power supply variations generated at the time of switching.

Such an increase in power supply noise NZ may have an effect on clock signals. That is, the clocks CK1 and CK2 are amplified by the clock drivers disposed in the domains D1 and D2, respectively, and are then provided to the flip flops. Each clock driver is configured with an inverter driven by the power supply voltage $V_{DD}$ or $V_{SS}$. Therefore, if the power supply voltages $V_{DD}$ and $V_{SS}$ vary, the pulse rise and fall edges of the clocks CK1 and CK2 vary temporally to cause clock jitter CJ, as shown by broken lines in FIG. 20. The magnitude of the clock jitter CJ corresponds to the magnitude of power supply noise NZ, and the clock jitter CJ increases when the rise edge of the clock CK1 is synchronous with that of the clock CK2.

Clock jitter contributes to a mismatch of the timing of clock edge in a plurality of flip flops constituting a single data path, thereby affecting the timing of data transfer. Specifically, a clock skew caused by layout is present in the clocks provided to the flip flops constituting the data path. The clock skew, combined with the clock jitter, increases or decreases the cycle time between flip flops, resulting in a mismatch of the timing of clock edges.

Such an increase or decrease of the cycle time between flip flops reduces the margins of set up time and hold time of the flip flops on the data path, and therefore causes to lower the logic highest operating frequency.

The control of clock skew is increasingly more difficult with miniaturization of transistors and with increasing logic scale. Further, when an asynchronous data transfer within the chip is required, inevitable result is that clocks having different phases and frequencies are present in a logic region.

In these circumstances, it is essential to control the generation of clock jitter. As discussed above, the power supply noise that causes clock jitter results from the fact that different domains to which different clocks (in phase and frequency) are applied operate with the power source of the same line.

Therefore, in order to eliminate the influence of power supply noise caused by different clocks, power supply voltages may be applied individually to each of the different domains to which different clocks are applied.

The conventional method of assigning power supply voltage described with reference to FIG. 19, however, complies with assignment of a single power supply voltage, thus failing to individually apply power supply voltages to different domains.

SUMMARY OF THE INVENTION

It is an object of the present invention to provide a method of designing a semiconductor device in which power supply voltages can be applied individually and clock jitter is suppressed to avoid a drop in logic operation rate.

The method of designing a semiconductor device of the invention in which plural clocks having different frequencies are applied to a logic region includes the following steps (a) to (e).

The step (a) is for dividing the logic region by the region of a logic operating with a specific clock, to obtain plural domains, the step (b) is for disposing plural power supply bumps in a matrix manner in the logic region and, based on a predetermined first rule, uniquely assigning plural power supply voltages of different types that correspond to the clocks respectively, to the power supply bumps, the step (c) is for disposing plural first power supply lines in parallel in a first layer and, based on a predetermined second rule, uniquely assigning the power supply voltages to the first power supply lines, the step (d) is for disposing plural second power supply lines in parallel in a second layer different from the first layer, such that they are orthogonal to the first power supply lines when viewed from above and, based on a predetermined third rule, uniquely assigning the power supply voltages to the second power supply lines; and the step (e) is for classifying the power supply voltages into a power supply voltage used in each of the plural domains and changing, based on the classification, the power supply voltages uniquely assigned to the power supply bumps and the first and second power supply lines, one by one of the plural domains.

After power supply voltages are uniquely assigned to the power supply bumps and first and second power supply lines in accordance with the first, second and third rules, the assignment is changed domain by domain, based on the classification of domains using plural power supply voltages. Thereby, the power supply corresponding to the clock type can be provided and the power supply bumps can be used effectively in each domain, thus obtaining a semiconductor device with enhanced voltage supply capability. In addition, power supply voltage can be applied individually, thus obtaining a semiconductor device in which clock jitter is suppressed to avoid a drop in logic operation rate.

A semiconductor device of the invention includes plural power supply bumps, plural first power supply lines and plural second power supply.

The plural power supply bumps are arranged in a matrix manner in a logic region.

The plural first power supply lines are disposed in parallel to each other to a first layer and are electrically connected to the power supply bumps. The plural second power supply lines are disposed in parallel to each other so as to be orthogonal to the first power supply lines when viewed from above, in a second layer different from the first layer, and are electrically connected to the first power supply lines. The plural power supply bumps are electrically connected to the first power supply lines via a relay conductor layer disposed in a layer underlying the first layer. In the semiconductor device of the invention, since the power supply bumps are not directly connected to the first power supply lines, the degree of freedom of arrangement of power supply bumps is increased to facilitate the design of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 16 to 18 are flowcharts illustrating the processing of electrical separation of active regions according to one preferred embodiment;

FIG. 19 is a diagram showing an example of arrangement of power supply bumps and power supply lines according to a conventional method of designing a semiconductor device; and FIG. 20 is a timing chart explaining a problem in a conventional semiconductor device.

DESCRIPTION OF THE PREFERRED EMBODIMENTS

Preferred embodiments of a method of designing a semiconductor device according to the present invention will be described. Referring now to FIGS. 1 to 7, the basic operation when implementing the invention is described below.

1. Arrangement and Assignment of Power Supply Bumps

When clocks of different types are applied to a logic region, in order to divide a domain by the clock type and apply power supply voltages domain by domain, it is necessary to dispose power supply bumps of different types BP.

However, disposing the power supply bumps being individual to the domains complicates manufacturing steps, which is therefore unpractical.

Hence, the present invention employs a method of uniquely determining the location of power supply bumps in a logic region in accordance with a predetermined rule (the first rule).

Figure 1:
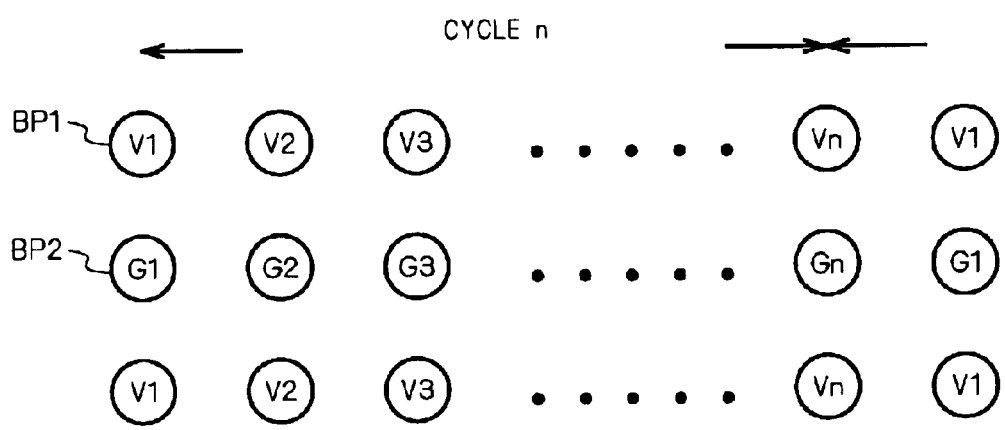
FIG. 1 is a diagram showing an example of arrangement of power supply bumps according to one preferred embodiment of the invention.

FIG. 1 shows an example of arrangement of power supply bumps. Specifically, there is shown the case of requiring n types of different power supply voltages, on the assumption that voltages V1 to Vn are taken as voltage corresponding to a drain power supply voltage $V_{DD}$, and voltages G1 to Gn are taken as voltage corresponding to a source power supply voltage $V_{SS}$, in a MOS transistor. Either of the group of voltages V1 to Vn and the group of voltages G1 to Gn becomes ground voltage, that is, 0 V. Therefore, n types of power supply voltages are essentially required. In what follows, the voltages G1 to Gn are regarded as ground voltage.

As shown in FIG. 1, the uppermost array is configured by laterally arranging plural power supply bumps BP1, to which voltages V1 to Vn are applied, and the next lower array is configured by laterally arranging plural power supply bumps BP2, to which voltages G1 to Gn are applied. That is, the arrangement of FIG. 1 longitudinally alternates the two types of arrays.

In the array of the power supply bumps BP1, as viewed in the figure, the assignment of voltages V1 to Vn is successively performed from the leftmost power supply bump BP1, and the same assignment is resumed from the (n+1)th power supply bump from the left. In such a fashion, the assignment of voltages V1 to Vn is repeated. This is referred to as a "repeat array on cycle n."

This is true for arrangement of power supply bumps BP2. That is, the assignment of voltages G1 to Gn is successively performed from the leftmost power supply bump BP2, and the same assignment is repeated.

Thus, in response to n types of power supply voltages, power supply voltages are repetitively assigned to the power supply bumps arranged in a matrix, on cycle n in a first direction, and the arrays of power supply bumps to which the power supply voltages V and G are assigned alternately are arranged in a second direction orthogonal to the first direction.

2. Arrangement and Assignment of Power Supply Lines

As described above with reference to FIG. 19, assuming only one type of power supply merely requires alternate assignment of power supply voltages V and G to the power supply lines WL1 (main lines) of the upper layer, which are connected to the power supply bumps BP. For plural types of power supplies, plural combinations of assignments to the power supply lines WL1 of the upper layer can be considered. The present invention however employs a method for assignment based on a simple rule.

Hereat, both of the clock type and power supply voltage type to be applied are indicated by n, and the power supply voltage is indicated by V1, V2, . . . Vn. When clock frequency is related to power supply voltage, it can be expressed as follows: F(V1), F(V2), . . . F(Vn). Processing for changing assignment of power supply voltage to the power supply bumps and power supply lines is performed such that the magnitude relationship of clock frequency satisfies the following expression: F(V1)>F(V2) . . . F(Vn).

Letting the logic scale of each domain (namely, the number of logic gates) be N(V1), N(V2), . . . N(Vn), and assuming the logic scale of each domain be approximately the same, the electric power consumptions P(V1), P(V2), . . . P(Vn) of the respective domains are proportional to operating frequency.

Figure 2:
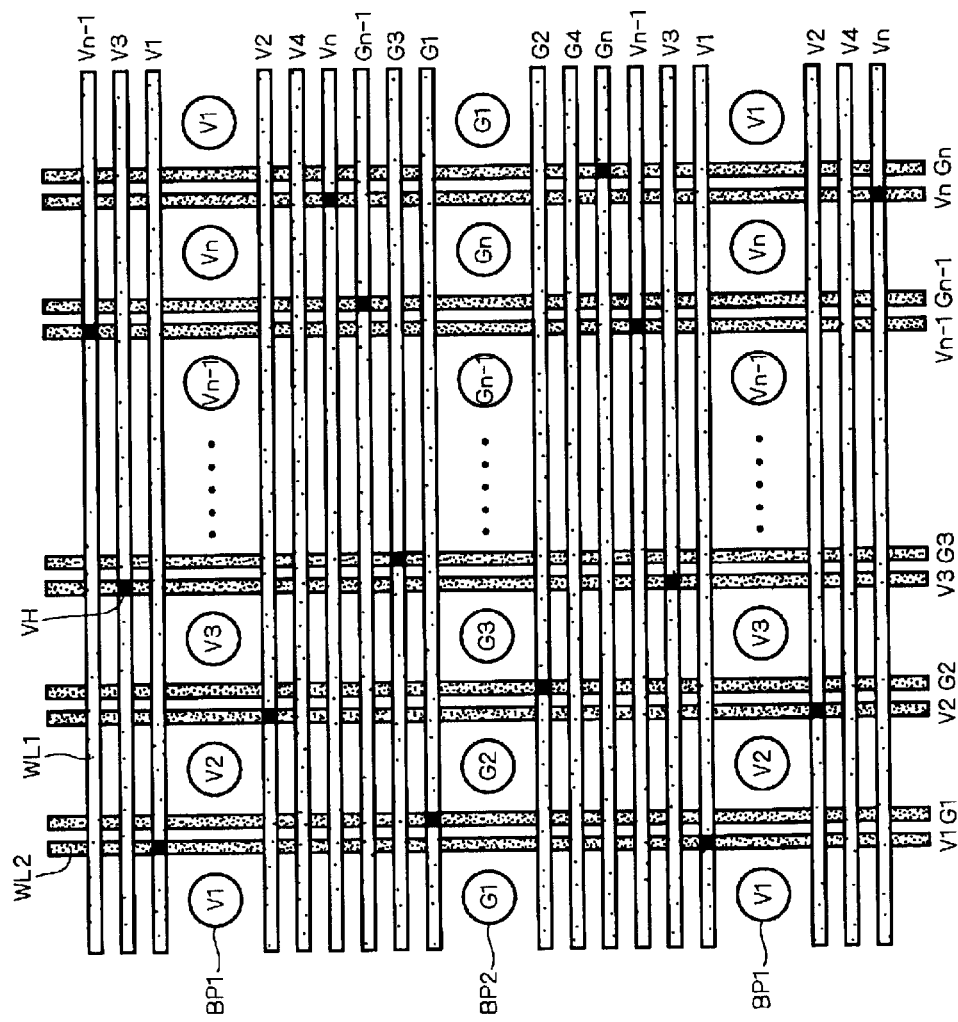
FIG. 2 is a diagram showing an example of arrangement of power supply bumps and power supply lines according to one preferred embodiment.

FIG. 2 shows an example of arrangement of power supply lines in accordance with the above rule. In FIG. 2, arrangement of power supply bumps BP1 and BP2 is based on the method described with reference to FIG. 1. Plural power supply lines WL1 of the upper layer, which are electrically connected to the power supply bumps BP1 and BP2, are arranged in parallel to the lateral arrays of power supply bumps BP1 and BP2. Plural power supply lines WL2 (branch lines) of the lower layer, which are electrically connected to the power supply lines WL1, are arranged in parallel to each other such that they are orthogonal to the power supply lines WL1, when viewed from above. Between the power supply lines WL1 and WL2, an interlayer insulating film is disposed to electrically separate the both.

As a result, the power supply bumps BP1 and BP2 are present at locations sandwiched by the power supply lines WL1 and WL2, when viewed from above, and they have no direct connection to the power supply lines WL1 and WL2. A method of connecting the power supply bumps BP1 and power supply lines WL1 will be described hereinafter.

In assigning power supply voltages to the power supply lines WL1 of the upper layer, which are electrically connected to power supply bumps, it is essential to assign the power supply corresponding to a domain to which a higher frequency clock is applied, to the power supply line located closer to the power supply bumps.

2-1. Assignment to Power Supply Lines WL1

Referring to FIG. 2, power supply voltages V1 and V2 are assigned to two power supply lines WL1 that are nearest neighbors across an array of power supply bumps BP1, and power supply voltages V3 and V4 are assigned to the next outer power supply lines WL1. In accordance with this rule (the second rule), assignment is repeated to a power supply voltage Vn.

In FIG. 2, power supply voltages of odd number, such as V1, V3, and Vn−1, are assigned to the upper power supply lines WL1 in an array of power supply bumps BP1, power supply voltages of even number, such as V2, V4, and Vn, are assigned to the lower power supply lines WL1 in the array of power supply bumps BP1. The assignment of the odd-numbered and even-numbered power supply voltages may be reversed, if only the power supply voltage corresponding to a domain to which a higher frequency clock is applied locates closer to the power supply bumps.

As shown in FIG. 2, power supply voltages G1 and G2 are assigned to two power supply lines WL1 that are nearest neighbors across an array of power supply bumps BP2, and power supply voltages G3 and G4 are assigned to the next outer power supply lines WL1. In accordance with this rule, assignment is repeated to a power supply voltage Gn.

In a plurality of domains to which clocks of different frequencies are applied, when the number of logics are approximately equal, the current passing through power supply bumps is proportional to the clock frequency. In FIG. 2, the power supply line WL1 that applies a power supply voltage to be applied to a domain using a higher frequency clock, is disposed closer to the power supply bumps, thereby reducing the distance from the power supply bump BP1 (BP2) to the power supply line WL1. This minimizes a drop in power supply voltage that is caused by the current flowing between the power supply bumps BP1 (BP2) and power supply lines WL1.

2-2. Assignment to Power Supply Lines WL2

In the foregoing, the description was proceeded based on that the plural power supply lines WL2 are disposed in parallel to each other such that they are orthogonal to the power supply lines WL1 when viewed from above. More specifically, the power supply lines WL2 are disposed in pairs between the arrays configured with longitudinally alternating power supply bumps BP1 and BP2 (hereinafter, referred to as an "alternate array of power supply bumps" in some cases).

Referring to FIG. 2, power supply voltages V1 and G1 are assigned to two power supply lines WL2 between the alternate array of power supply bumps BP1 and BP2 to which power supply voltages V1 and G1 are assigned respectively, and the alternate array of power supply bumps BP1 and BP2 to which power supply voltages V2 and G2 are assigned respectively. In a similar manner, power supply voltages V2 and G2 are assigned to two power supply lines WL2 between the alternate array of power supply bumps BP1 and BP2 to which power supply voltages V2 and G2 are assigned respectively, and the alternate array of power supply bumps BP1 and BP2 to which power supply voltages V3 and G3 are assigned respectively. Thereafter, in accordance with this rule (the third rule), assignment is performed to the two power supply lines WL2 between the alternate array of power supply bumps BP1 and BP2 to which power supply voltages Vn and Gn are assigned respectively, and the alternate array of power supply bumps BP1 and BP2 to which power supply voltages V1 and G1 are assigned respectively.

The power supply lines WL1 and WL2 are electrically connected by via contacts VH. The via contacts VH are obtained by filling, with a conductive material, via holes that are formed by etching etc., so as to penetrate through an interlayer insulating film for electrical separation between the lines WL1 and WL2.

For example, power supply lines WL1 to which a power supply voltage V3 is assigned are electrically connected through via contacts VH to power supply lines WL2 to which a power supply voltage V3 is assigned. In FIG. 2, since there are shown two power supply lines WL1 to which a power supply voltage V3 is assigned, power supply lines WL2 to which a power supply voltage V3 is assigned, are electrically connected through via contacts VH to locations at which the power supply lines WL2 are orthogonal to the two power supply lines WL1, when viewed from above.

3. Method of Connecting Power Supply Bumps and Power Supply Lines

The conventional method described with reference to FIG. 19 employs the configuration of directly connecting the power supply bumps BP to the power supply lines WL1. Whereas in the present invention, the power supply bumps BP1 and BP2 are arranged at locations sandwiched by the power supply lines WL1. Therefore, branches for connection are disposed in the power supply bumps BP1 and BP2, thereby making connection to the power supply lines WL1 through the branches. Various connections between the power supply bumps and power supply lines will be described below by referring to FIGS. 3 to 7.

Figure 3:
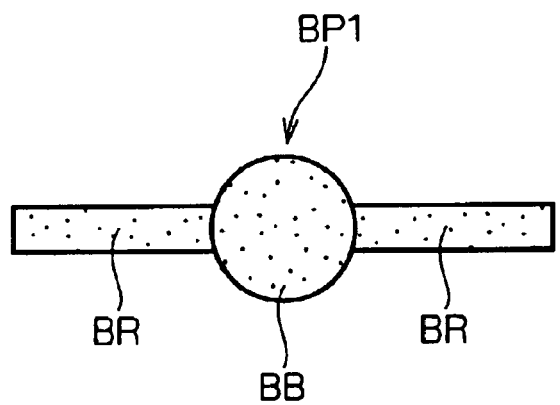
FIGS. 3 to 7 are diagrams illustrating a method of connecting power supply bumps and power supply lines according to one preferred embodiment.

FIG. 3 shows the most basic configuration of power supply bump BP1, in which two branches BR extend from a bump body BB in opposite directions. The branches BR are formed by a conductor of the same material as the bump body BB, and are disposed in the same layer as the power supply lines WL1.

Figure 4:
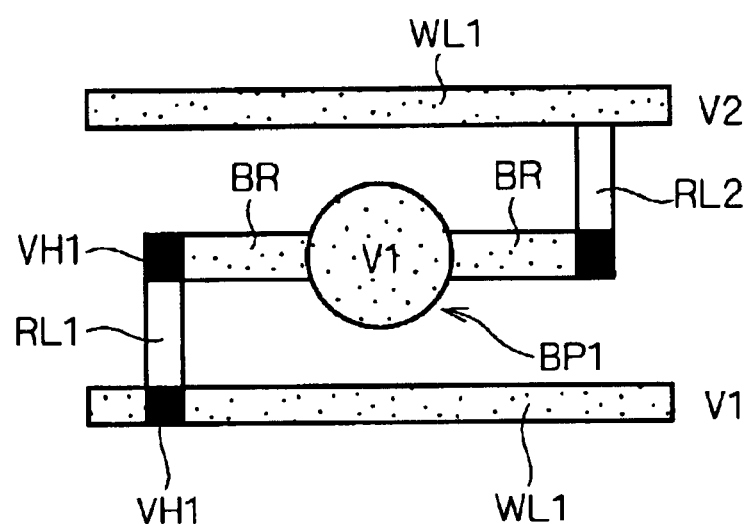

FIG. 4 shows an example of making connection to the power supply lines WL1 by using the power supply bump BP1 (the same is true for BP2), having the basic configuration shown in FIG. 3.

The power supply bump BP1 of FIG. 4 is a bump to which a power supply voltage V1 is assigned, and its two branches BR are connected through via contacts VH1 to relay conductor layers RL1 and RL2 underlying the branches BR.

The relay conductor layers RL1 and RL2 are conductor layers extending, when viewed from above, in a direction orthogonal to the power supply lines WL1 that are disposed in parallel to each other so as to sandwich the power supply bump BP1. The relay conductor layer RL1 extends from the underside of one branch BR to the underside of the power supply line WL1 to which a power supply voltage V1 is assigned. The relay conductor layer RL2 extends from the underside of the other branch BR to the underside of the power supply line WL1 to which a power supply voltage V2 is assigned.

Specifically, the relay conductor layer RL1 is electrically connected through the via contacts VH1 to the power supply line WL1 to which the power supply voltage V1 is assigned. Whereas the relay conductor layer RL2 is not electrically connected to the power supply line WL1 to which the power supply voltage V2 is assigned. With this configuration, the power supply voltage V1 applied to the power supply bump BP1 can be applied to a predetermined power supply line WL1.

Figure 5:
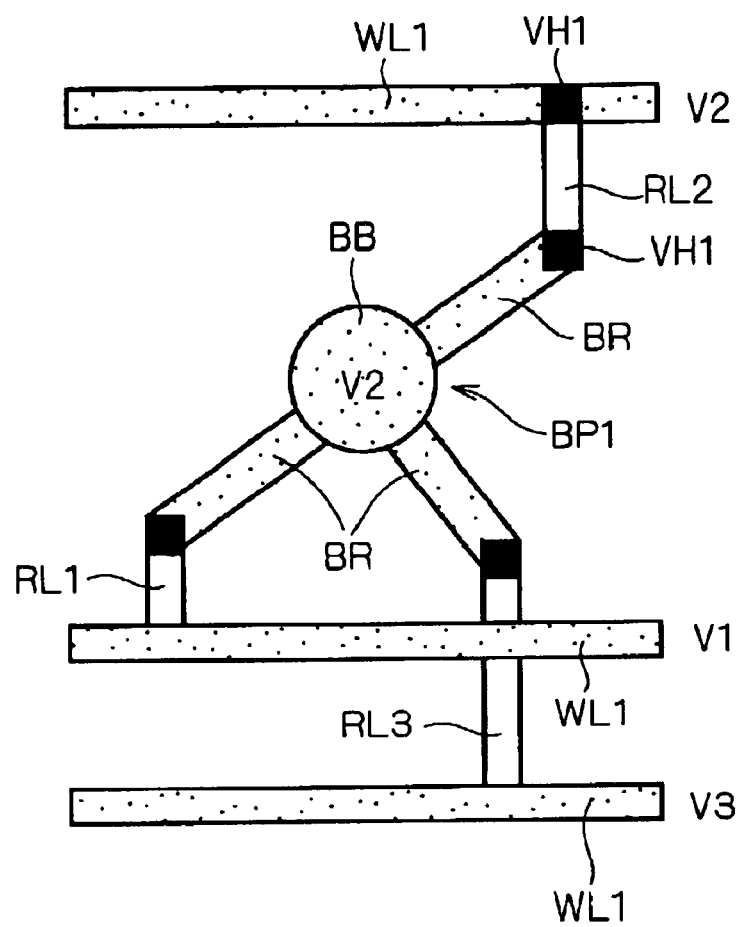

It is capable of coping with more types of power supply voltages by increasing the number of braches BR. FIG. 5 shows such a configuration that branches BR extend in different three directions from a bump body BB.

Specifically, a power supply bump BP1 of FIG. 5 is a bump to which a power supply voltage V2 is assigned, and its three branches BR are connected through via contacts VH1 to relay conductor layers RL1, RL2, and RL3.

The relay conductor layer RL1 extends from the underside of a first branch BR to the underside of the power supply line WL1 to which a power supply voltage V1 is assigned. The relay conductor layer RL2 extends from the underside of a second branch BR to the underside of the power supply line WL1 to which a power supply voltage V2 is assigned. The relay conductor layer RL3 extends from the underside of a third branch BR to the underside of the power supply line WL1 to which a power supply voltage V3 is assigned.

With this configuration, only the relay conductor layer RL2 is electrically connected through the via contacts VH1 to the power supply line WL1 to which the power supply voltage V2 is assigned.

Figure 6:
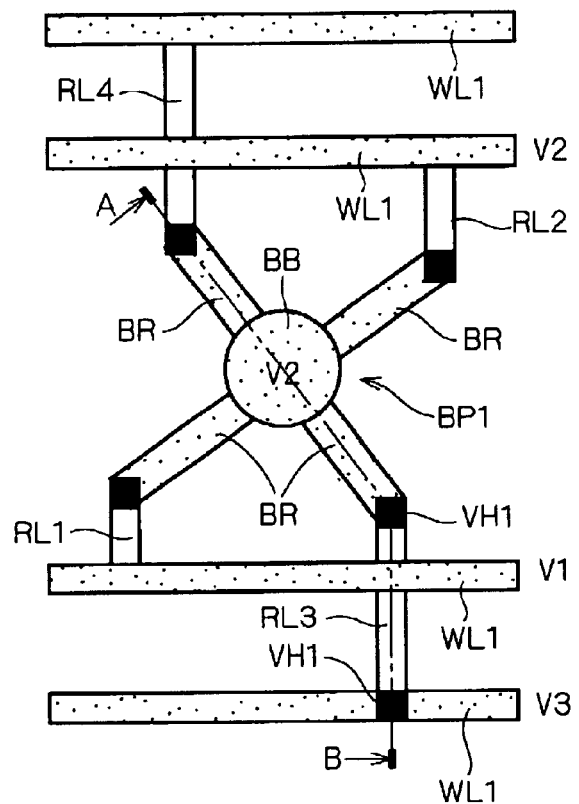

Referring to FIG. 6, a power supply bump BP1 is a bump to which a power supply voltage V3 is assigned, and has four branches BR extending in different four directions from a bump body BB. The branches BR are connected through via contacts VH1 to relay conductor layers RL1, RL2, RL3 and RL4, respectively.

The relay conductor layer RL1 extends from the underside of a first branch BR to the underside of the power supply line WL1 to which a power supply voltage V1 is assigned. The relay conductor layer RL2 extends from the underside of a second branch BR to the underside of the power supply line WL1 to which a power supply voltage V2 is assigned. The relay conductor layer RL3 extends from the underside of a third branch BR to the underside of the power supply line WL1 to which a power supply voltage V3is assigned. The relay conductor layer RL4 extends from the underside of a fourth branch BR to the underside of the power supply line WL1 to which a power supply voltage V4 is assigned.

With this configuration, only the relay conductor layer RL3 is electrically connected through the via contacts VH1 to the power supply line WL1 to which the power supply voltage V3 is assigned.

Figure 7:
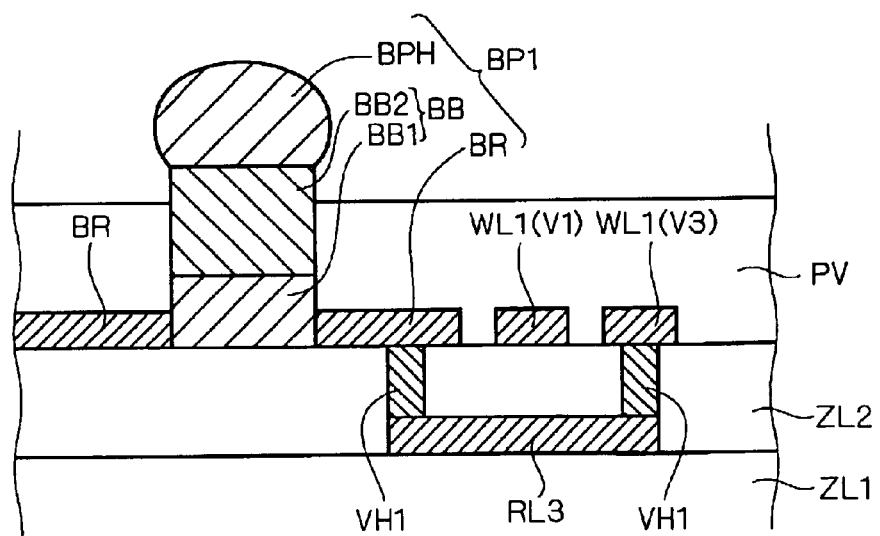

FIG. 7 shows a sectional configuration viewed from the direction indicated by the arrows A and B shown in FIG. 6. In the configuration of FIG. 7, power supply lines WL1 and branches BR are disposed on such a structure that interlayer insulating films ZL1 and ZL2 are stacked in this order.

The bump body BB of power supply bump BP1 is configured with a first body BB1 disposed on the interlayer insulating film ZL1 and a second body BB2 disposed on the first body BB1. The first body BB1 is formed by the same material and in the same step as the branches BR. A bump head BPH is disposed on the bump body BB. The bump head BPH is electrically connected to external wiring and the like.

The branches BR are electrically connected to the relay conductor layer RL3 through the via contacts VH1 penetrating through the interlayer insulating film ZL2. The relay conductor layer RL3 extends from the underside of the power supply line WL1 to which the power supply voltage V1 is assigned, to the underside of the power supply line WL1 to which the power supply voltage V3 is assigned. The relay conductor layer RL3 is electrically connected to the power supply lines WL1 through the via contacts VH1.

Disposed on the interlayer insulating film ZL2 is an insulative protection film PV to cover the power supply lines WL1 and branches BR. The bump body BB penetrates through the protection film PV and projects therethrough.

Thus, the power supply bumps BP1 and BP2 have the branches for connection with the power supply lines WL1. Connection through the branches to the power supply lines WL1 increases the degree of freedom in arrangement of the power supply bumps BP1 and BP2. As described with reference to FIG. 1, even when the locations of power supply bumps are determined uniquely in accordance with the predetermined rule, this may cause no trouble in electrical connection to the power supply lines WL1.

In addition, an efficient formation is achievable by configuring, with the wiring layer of the same layer, the power supply bumps BP1 and BP2 serving as a source of power supply, and the power supply lines WL1 serving as a main line for providing power supply.

4. Examples of Assignment of Power Supply Voltages

On the basis of the above basic operation, concrete examples of a method of assigning power supply voltage will be described by referring to FIGS. 9 to 12.

4-1. Determination of Floor Plan

Figure 8:
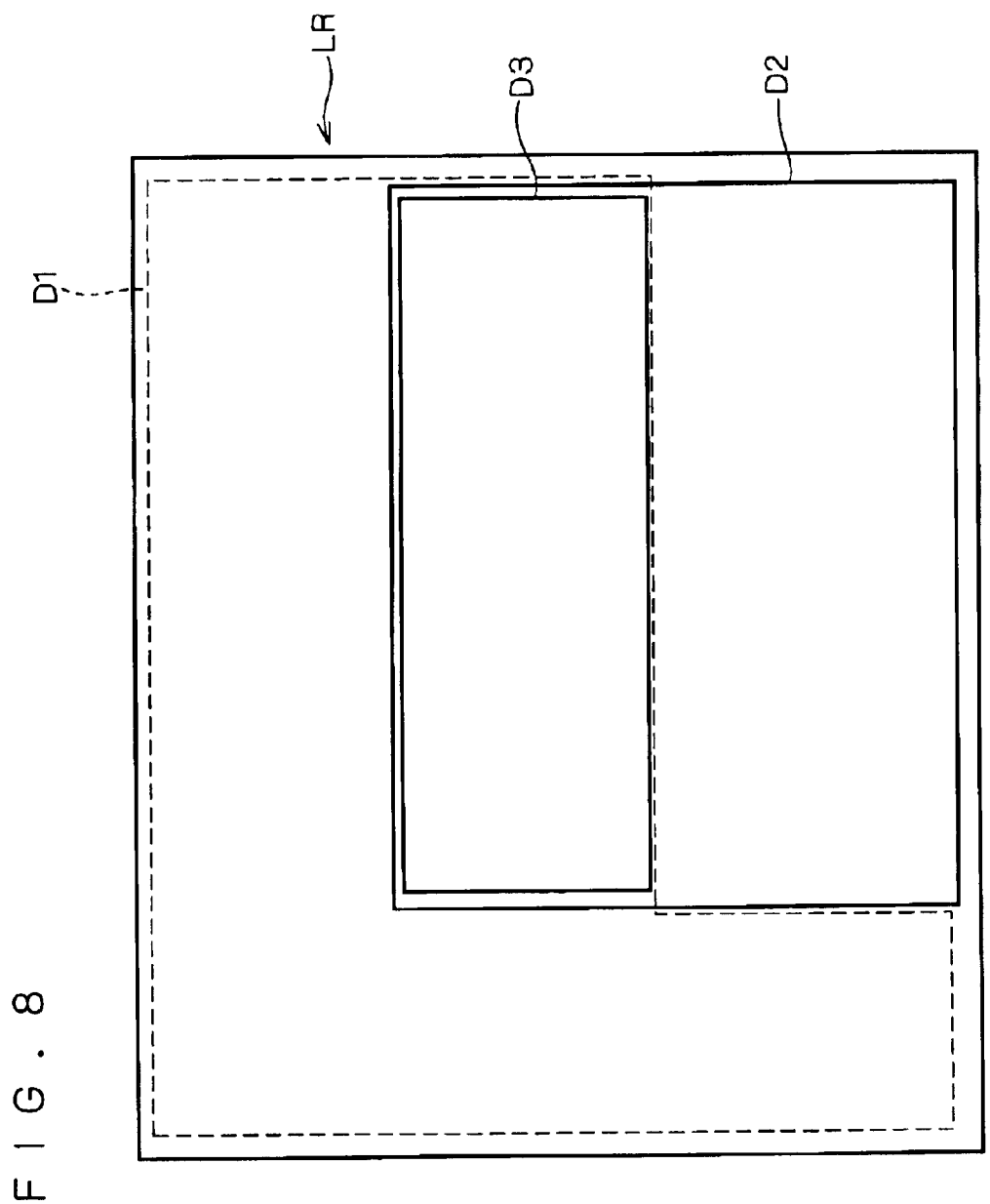
FIGS. 8 to 10 are diagrams illustrating an exemplary method of assigning power supply voltage according to one preferred embodiment.

First, a floor plan of a logic region is determined as shown in FIG. 8. The term "floor plan" is to divide a logic region depending on the type of clock applied. FIG. 8 shows, for example, a floor plan to divide a logic region LR on a semiconductor substrate into three domains D1, D2 and D3.

Hereat, the domains D1 and D2 are regions to which clocks CK1 and CK2 are provided, and the domain D3 is a region to which both of the clocks CK1 and CK2 are provided.

In many cases, such clocks of different types are provided to a single domain, in which case the assignment of power supply voltage can be simplified by defining domains to which clocks of different types are provided, as an individual domain.

Since in the example of FIG. 8, clocks of two types CK1 and CK2 are applied, there are used only power supply voltages V1, V2, and the corresponding power supply voltages G1, G2. Specifically, the power supply voltages V1 and G1 correspond to the domain D1 to which the clock CK1 is applied. The power supply voltages V2 and G2 correspond to the domain D2 to which the clock CK2 is applied. The clock CK1 has a higher frequency than the clock CK2.

4-2. Arrangement of Power Supply Bumps and Changes in Assignment of Power Supply Voltages After the floor plan is determined, power supply bumps are arranged and power supply voltages are assigned. Assignment of power supply voltages to power supply bumps is performed in accordance with the rule described with reference to FIG. 1.

Figure 9:
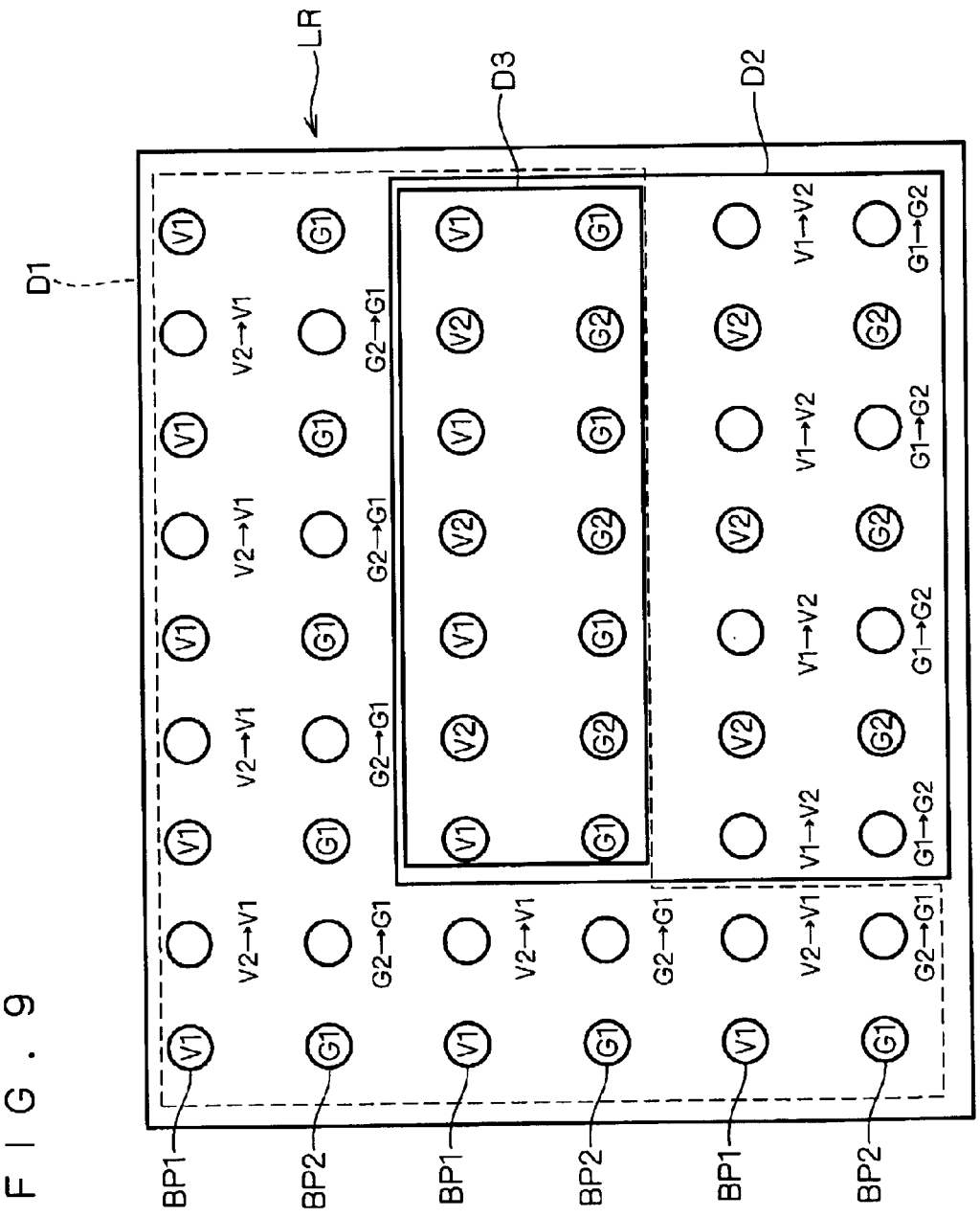

Referring to FIG. 9, power supply bumps are arranged in a matrix over the entire area of a logic region LR. Specifically, to the uppermost row of bumps laterally disposed as viewed in the figure, assignment is performed from the left by repeatedly alternating voltages V1 and V2 in this order, and the next lower row of bumps, assignment is performed from the left by repeatedly alternating voltages G1 and G2 in this order. These assignments are repeated longitudinally to obtain such a configuration that a lateral array of plural power supply bumps BP1 to which the voltage V1 or V2 is applied, and a lateral array of plural power supply bumps BP2 to which the voltage G1 or G2 is applied, are arranged alternately and longitudinally.

Since the arrangement of power supply bumps is performed referring to a floor plan, such that no power supply bump is disposed above the boundary between domains, all the power supply bumps are not always equally spaced.

After the power supply voltages are assigned to the power supply bumps, the assignment is changed referring to the floor plan. FIG. 9 also illustrates changes made in the assignment. In FIG. 9, the assignment to the domain D1 is changed as follows: a power supply voltage V1 is assigned to the power supply bump BP1 to which the power supply voltage V2 has been assigned; and a power supply voltage G1 is assigned to the power supply bump BP2 to which the power supply voltage G2 has been assigned.

In the domain D2, a power supply voltage V2 is assigned to the power supply bump BP1 to which the power supply voltage V1 has been assigned; and a power supply voltage G2 is assigned to the power supply bump BP2 to which the power supply voltage G1 has been assigned.

In the domain D3 to which both clocks CK1 and CK2 are provided, the original assignment is retained, thereby obtaining the power supply bump BP1 to which the power supply voltage V1 or V2 is assigned, and the power supply bump BP2 to which the power supply voltage G1 or G2 is assigned.

4-3. Arrangement of Power Supply Lines and Changes in Assignment

After changing the assignment of power supply voltages to the power supply bumps, arrangement and assignment of power supply lines are performed. Assignment of power supply voltages to the power supply lines is performed in accordance with the rule described with reference to FIG. 2.

Figure 10:
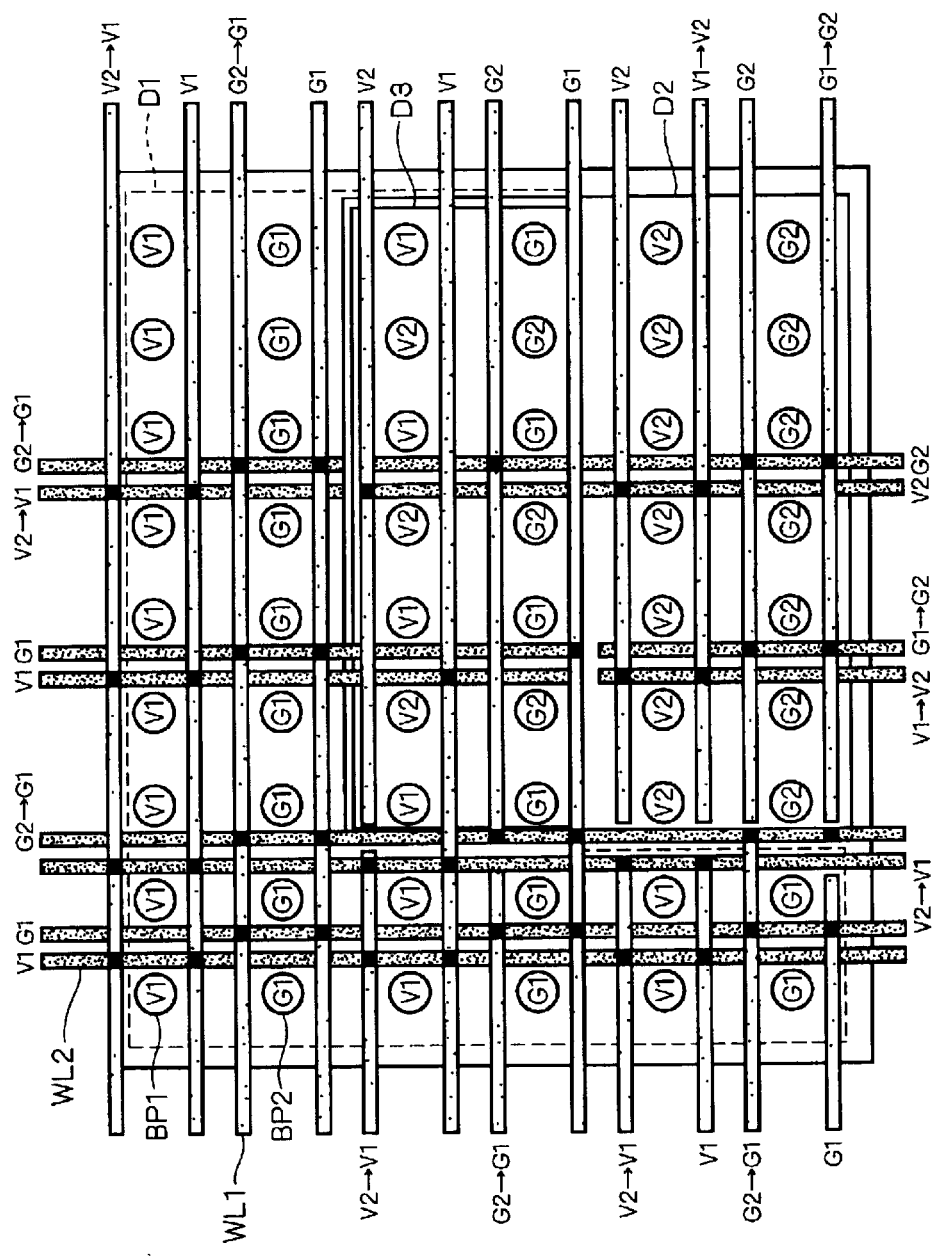

Referring to FIG. 10, a plurality of power supply lines WL1 electrically connected to power supply bumps BP1 and BP2, are laterally disposed in parallel to each other in lateral arrays of the power supply bumps BP1 and BP2. A plurality of power supply lines WL2 of the lower layer, which are electrically connected to the power supply lines WL1, are disposed in parallel to each other such that they are orthogonal to the power supply lines WL1, when viewed from above.

Power supply voltages V1 and V2 are assigned to two power supply lines WL1 that are nearest neighbors across an array of power supply bumps BP1, and power supply voltages G1 and G2 are assigned to two power supply lines WL1 that are nearest neighbors across an array of the power supply bumps BP2. This pattern is repeated to complete the assignment of power supply voltages to all the power supply lines WL1 on a logic region LR.

Power supply lines WL2 are disposed in parallel to each other such that they are orthogonal to the power supply lines WL1, when viewed from above. At this time, the power supply lines WL2 are disposed in pairs between the alternate arrays of the power supply bumps BP1 and BP2. The paired power supply lines WL2 are electrically connected to the power supply lines of the lower layer which provide power supply to a gate array formed on the semiconductor substrate, so that the power supply lines WL2 provide power supply voltages to the source/drain layer of the gate array.

Then, power supply voltages V1 and G1 are assigned to the leftmost paired power supply lines WL2, respectively, and power supply voltages V2 and G2 are assigned to the next succeeding paired power supply lines WL2. This pattern is repeated to complete the assignment of power supply voltages to all the power supply lines WL2 on the logic region LR.

After the power supply voltages are assigned to the power supply lines WL1 and WL2, the power supply lines WL1 and WL2 are cut and the assignment of power supply voltages is changed by referring to the floor plan. FIG. 10 also illustrates such cutting and changes.

An example of changes in the assignment will be described below by referring to FIG. 10. That is, the power supply voltage V1 is assigned to the uppermost power supply line to which the power supply voltage V2 has been assigned, because this power supply line WL1 is located entirely above a domain D1. In addition, the power supply voltage G1 is assigned to the third power supply line from the uppermost one, to which the power supply voltage G2 has been assigned, because this power supply line WL1 is located entirely above the domain D1.

Since the fifth power supply line WL1 from the uppermost one, to which the power supply voltage V2 has been assigned, extends across the domains D1 and D3, this power supply line WL1 is cut above the boundary between the domains D1 and D3. As a result, a power supply voltage V1 is assigned to the part locating above the domain D1, and the original assignment is retained in the part locating above the domain D3. Likewise, the seventh power supply line WL1 from the uppermost one, to which the power supply voltage G2 has been assigned is cut above the boundary between the domains D1 and D3. As a result, the assignment to the part locating above the domain D1 is changed to the power supply voltage G1, and the original assignment is retained in the part locating above the domain D3.

Although the sixth power supply line WL1 from the uppermost one, to which the power supply voltage V1 is assigned, extends across the domains D1 and D3, it is unnecessary to cut this power supply line WL1 because the power supply voltage V1 is also used in the domain D3. Therefore no change is made in the assignment of power supply voltage.

Since the ninth power supply line WL1 from the uppermost one, to which the power supply voltage V2 has been assigned, extends across the domains D1 and D2, this power supply line WL1 is cut above the boundary between the domains D1 and D2. As a result, a power supply voltage V1 is assigned to the part locating above the domain D1, and the original assignment is retained to the part locating on the domain D2. Such processing is performed to all the power supply lines WL1.

A similar processing is performed to the power supply lines WL2. That is, power supply voltages V1 and G1 are assigned respectively to the third and fourth power supply lines WL2 from the leftmost one in FIG. 10, to which power supply voltages V2 and G2 have been assigned respectively, because these lines WL2 are located entirely above the domain D1.

Although the fifth and sixth power supply lines WL2 from the leftmost one, to which power supply voltages V1 and G1 have been assigned respectively, extend across the domains D1, D3, and D2, it is unnecessary to cut these power supply lines WL2 above the boundary between the domains D1 and D3, because the power supply voltage V1 is also used in the domain D3. But it is necessary to cut these supply lines WL2 above the boundary between the domains D3 and D2. As a result, the original assignments to the parts locating above the domains D1 and D3 are retained, and power supply voltages V2 and G2 are respectively assigned to the part locating above the domain D2. Such processing is performed to all the power supply lines WL2.

After the foregoing processing is completed, via contacts VH are disposed such that the power supply lines WL1 and WL2 to which the same power supply voltage is applied are electrically connected at the portions where both lines are orthogonal to each other when viewed from above.

Electrical connection of power supply bumps BP1 and BP2 to the power supply lines WL1 may be performed by using the power supply bumps BP1 (BP2) having the basic configuration as described with reference to FIG. 3.

Figure 11:
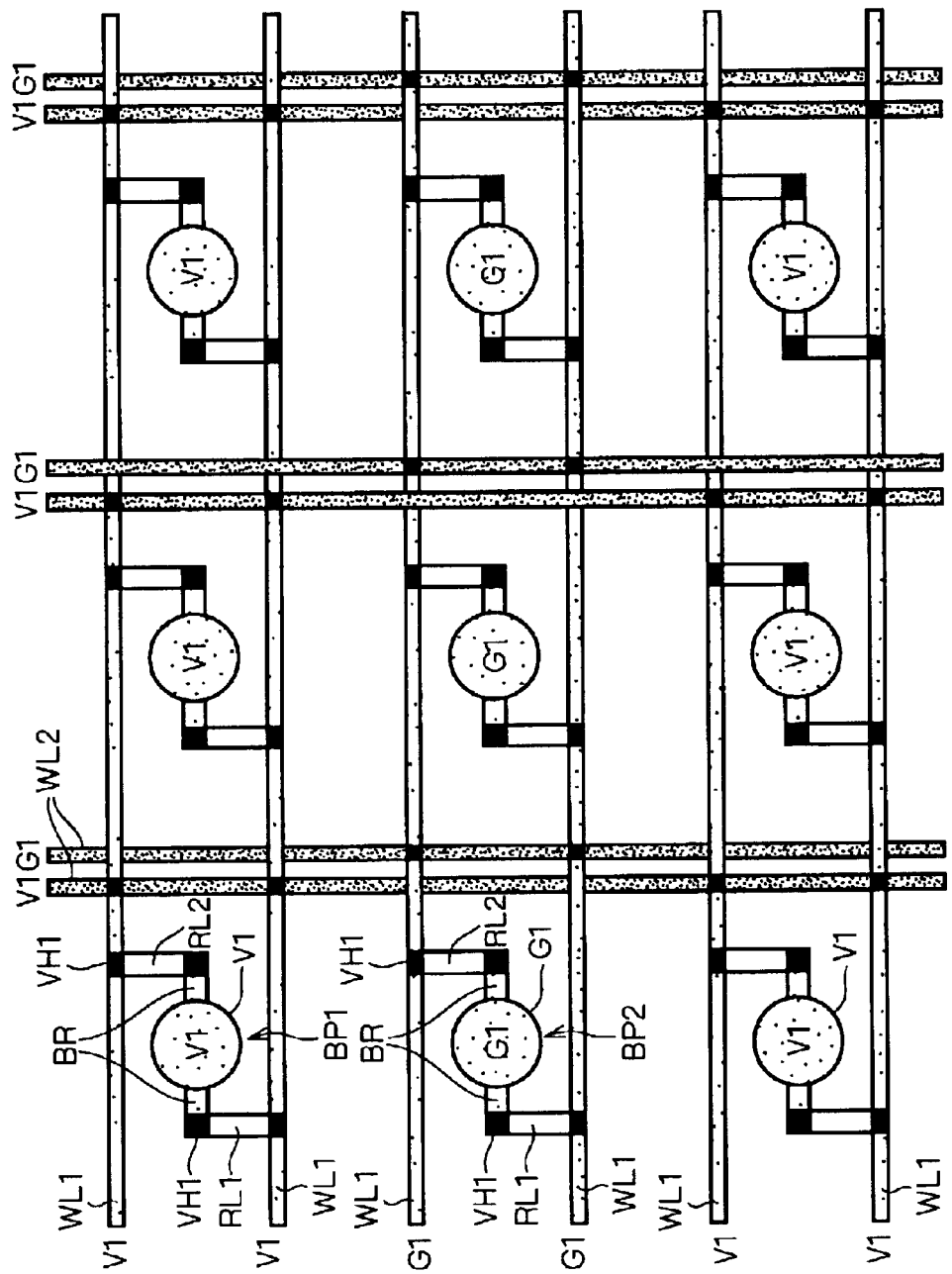
FIGS. 11 and 12 are diagrams illustrating another method of connecting power supply bumps and power supply lines according to one preferred embodiment.

FIG. 11 shows an example of electrical connections of the power supply bumps BP1 and BP2 to the power supply lines WL1 in a domain D1 using only clock CK1, and also shows an example of electrical connections of the power supply bumps BP1 and BP2 to the power supply lines WL1 in a domain D3 using both clocks CK1 and CK2.

Referring to FIG. 11, all the power supply bumps BP1 are bumps to which a power supply voltage V1 is assigned, and their two branches BR are connected through via contacts VH1 to relay conductor layers RL1 and RL2 underlying the branches BR.

To both of the two power supply lines WL1 sandwiching an array of power supply bumps BP1, a power supply voltage V1 is assigned. The relay conductor layers RL1 and RL2 extend from the underside of the branches BR to the underside of the two power supply lines WL1 respectively, so that these layers RL1 and RL2 are electrically connected to each other through the via contacts VH1.

Likewise, all the power supply bumps BP2 are bumps to which a power supply voltage G1 is assigned, and their two branches BR are connected through via contacts VH1 to relay conductor layers RL1 and RL2 underlying the branches BR.

To both of the two power supply lines WL1 sandwiching an array of power supply bumps BP2, the power supply voltage G1 is assigned. The relay conductor layers RL1 and RL2 extend from the underside of the branches BR to the underside of the two power supply lines WL1 respectively, so that these layers RL1 and RL2 are electrically connected to each other through the via contacts VH1.

Figure 12:
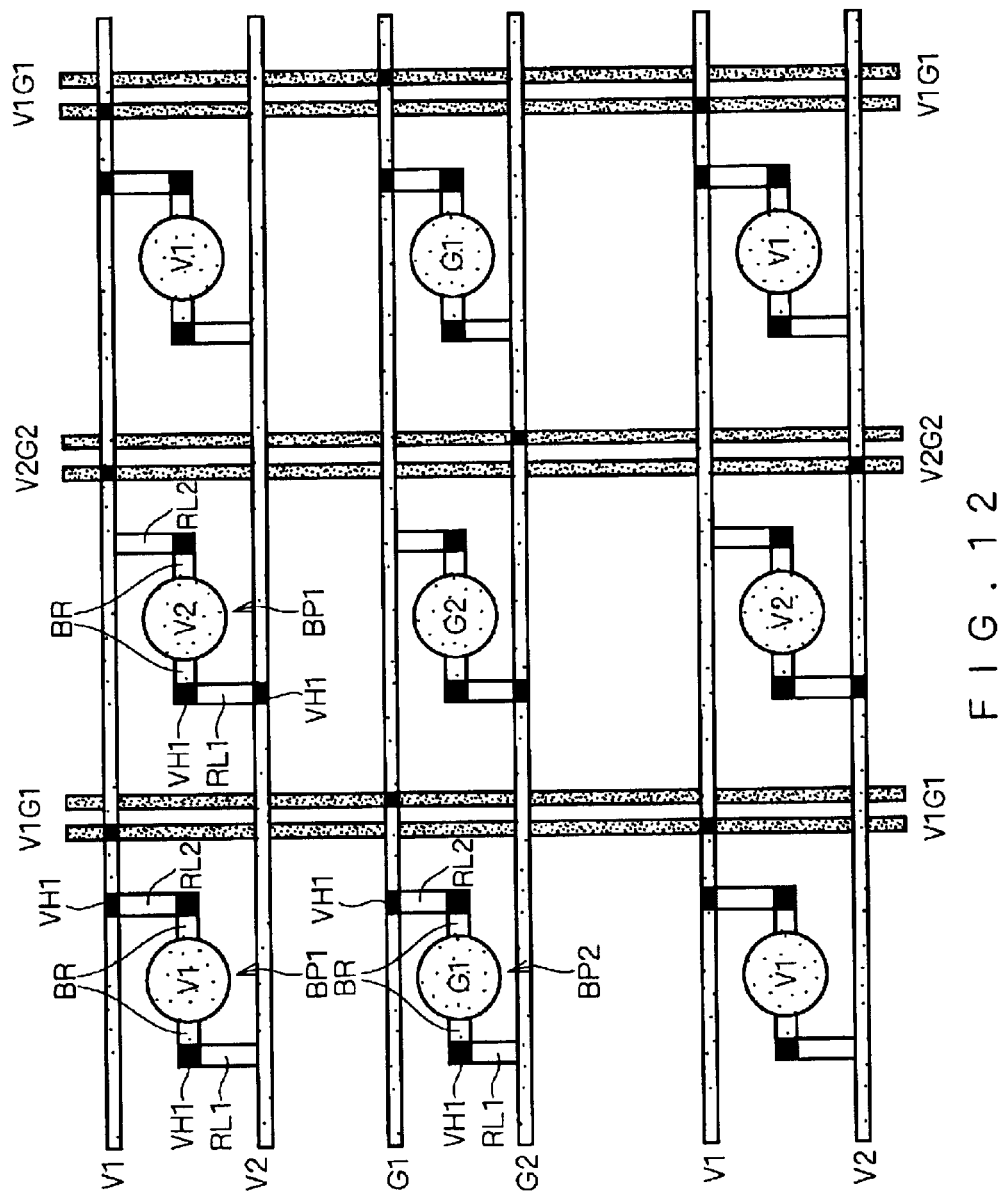

Referring to FIG. 12, an array of power supply bumps BP1 comprises alternate power supply bumps to which a power supply voltage V1 is assigned and power supply bumps to which a power supply voltage V2 is assigned. In the power supply bump BP1 to which the power supply voltage V1 is assigned, a relay conductor layer RL2 extending to the power supply line WL1 to which the power supply voltage V1 is assigned, is electrically connected to this line WL1 through via contacts VH1. Whereas a relay conductor layer RL1 extending to the power supply line WL1 to which the power supply voltage V2 is assigned, is not electrically connected to this line WL1.

In the power supply bump BP1 to which the power supply voltage V2 is assigned, a relay conductor layer RL1 extending to the power supply line WL1 to which a power supply voltage V2 is assigned, is electrically connected to this line WL1 through via contacts VH1. Whereas a relay conductor layer RL2 extending to the power supply line WL1 to which a power supply voltage V1 is assigned is not electrically connected to this line WL1. This is true for the power supply bumps BP2. That is, the bump to which a power supply voltage G1 is assigned and the bump to which a power supply voltage G2 is assigned, have different connection relationships between relay conductor layers RL1, RL2, and power supply lines WL1.

With this configuration, the power supply voltages V1 and V2 assigned to the power supply bump BP1, and the power supply voltages G1 and G2 assigned to the power supply bump BP2, can be provided to a predetermined power supply line WL1.

5. Resulting Effects

As stated above, the assignments of power supply voltages to power supply bumps are performed in accordance with the predetermined simple rule. Based on the floor plan, the obtained assignment is then changed so as to correspond to the power supply voltage used in each domain.

Subsequently, in accordance with the predetermined simple rule, power supply lines are arranged and power supply voltages are assigned. Thereafter, if a power supply voltage assigned to a power supply line extending across plural domains is not common to the power supply voltages used in the plural domains, this power supply line is cut and divided above the boundary between the domains. The obtained power supply lines are each inherent in the corresponding domain.

In the assignment of power supply voltages to the obtained power supply lines, the necessary changes are made as follows. To the domain using plural types of clocks, the power supply voltage corresponding to each clock is assigned suitably. To the domain using a single type of clock, only the power supply voltage corresponding to this clock is provided. This enables to provide the power supply voltage corresponding to the clock type, and also permits an effective use of power supply bump in each domain, thereby enhancing voltage supply capability. In addition, there are the following advantages.

Since power supply voltage can be individually applied to different domains, it is capable of obtaining a semiconductor device in which clock jitter is suppressed to avoid a drop in logic operation rate.

The power supply lines electrically connected to the power supply bumps are arranged in accordance with the following rule that a certain power supply line that provides the power supply voltage corresponding to a domain to which a higher frequency clock is applied, locates closer to the power supply bumps. Therefore, the distance from the power supply bumps to the power supply line is reduced to minimize a drop in power supply voltage that is caused by the current flowing between the power supply bumps and power supply line.

Completely separating power supply per clock suppresses the occurrences of power supply noise and clock jitter due to asynchronous operation of clocks, thereby ensuring the margins of circuit malfunction and transfer timing.

6. Modifications

The foregoing preferred embodiment is proceeded on the assumption that the logic scales of domains, $N(V1)$, $N(V2)$, . . . $N(Vn)$, are approximately equal. When there is a large difference in logic scale, the electric power consumptions of the domains, $P(V1)$, $P(V2)$, . . . $P(Vn)$, are proportional to the logic scale, irrespective of its clock frequency.

In this instance, the assignment of power supply voltages to power supply bumps and power supply lines may be changed so as to satisfy the following magnitude relationship of logic scale: $N(V1) > N(V2) > \ldots > N(Vn)$.

As a result, with respect to the power supply lines electrically connected to the power supply bumps, a power supply line providing power supply voltage to a domain having a larger logic scale (electric power consumption) is located closer to the power supply bumps, thus reducing the distance from the power supply bumps to the power supply line. This minimizes a drop in power supply voltage that is caused by the current flowing between the power supply bumps and power supply lines.

Although the foregoing preferred embodiment shows the example that the power supply lines WL1 overlie the power supply lines WL2, the power supply lines WL2 may overly the power supply lines WL1. In this instance, the resulting effect of the invention is the same, except to elongate the distance from the power supply lines WL2 to the power supply lines WL3 of the lowermost layer.

7. Electrical Separation of Active Regions

The essence of changes in the assignment of power supply voltages to the power supply lines WL1 and WL2 has been described with reference to FIG. 10. In a similar manner, the assignment of power supply voltages is changed with respect to the power supply lines of the lowermost layer which provide power supply to the gate array formed on the semiconductor substrate.

At that time, such domains using clocks of different types, as the domains D1 and D2 shown in FIG. 10, differ from one another in the power supply voltage used. Therefore, to avoid that the power supply voltages mutually interfere through the semiconductor substrate, electrical separation is made between the active regions of the domains D1 and D2 to be formed in the surface of the semiconductor substrate.

For the purpose of this, an insulating layer may be disposed at the portions corresponding to the boundary between the domains D1 and D2. However, the gate array structure can be used because the gate array is disposed on the semiconductor substrate, as previously described.

7-1. Plan Configuration of Domain Boundary Portions

Figure 13:
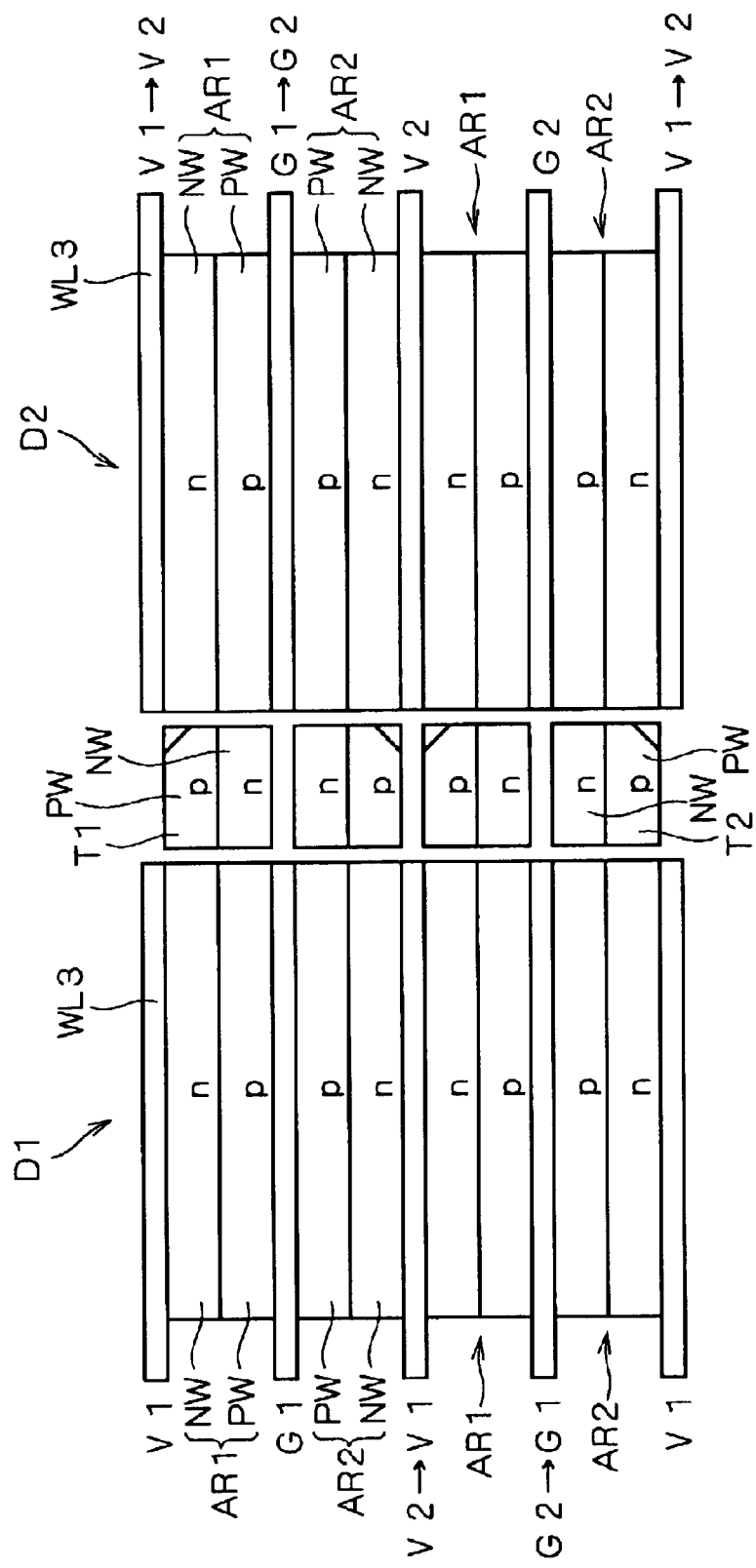
FIGS. 13 and 14 are diagrams illustrating a method of electrical separation between domains according to one preferred embodiment.

FIG. 13 is a plan view illustrating the electrical separation of domains D1 and D2, in gate array level. As viewed in FIG. 13, the gate array structure in the domain D1 is shown on the left side and that in the domain D2 is shown on the right side.

In the domains D1 and D2 of FIG. 13 wherein a plurality of power supply lines WL3 are arranged in parallel, region AR1 or AR2 that consists of a well region PW having a p-type impurity and a well region NW having an n-type impurity, is disposed in the surface of the semiconductor substrate between adjacent power supply lines WL3. An N-channel MOS transistor is formed in the well region PW, and a P-channel MOS transistor is formed in the well region NW.

As used herein, the term "gate array structure" precisely means the structure that a plurality of gate electrodes are arranged in an array on the active regions AR1 or AR2. Since this structure is well known, its description is omitted. Instead, the alternate array consisting of the active regions AR1, AR2, and power supply lines WL3 is hereafter referred to as a "gate array structure."

In the domain D1, power supply voltages V1, G1, V1, G1, and V1 are assigned in this order from the uppermost power supply line WL3. This is because the domain D1 uses only power supply voltages V1 and G1. The power supply voltage V2, which has been assigned to the third power supply line WL3 from the uppermost one, is changed to a power supply voltage V1. The power supply voltage G2, which has been assigned to the fourth power supply line WL3 from the uppermost one, is changed to a power supply voltage G1.

Between the uppermost power supply line WL3 and the next lower power supply line WL3, there is disposed an active region AR1 consisting of well regions NW and PW arranged in this order from the top, as viewed in FIG. 13 (i.e., the active region where the power supply line to which the power supply voltage V is assigned overlies the power supply line to which the power supply voltage G is assigned). Between the second and third power supply line WL3 from the uppermost one, there is disposed an active region AR2 consisting of well regions PW and NW arranged in this order from the top, as viewed in FIG. 13 (i.e., the active region where the power supply line to which the power supply voltage G is assigned overlies the power supply line to which the power supply voltage V is assigned). The active regions AR1 and AR2 are disposed alternately.

The power supply voltages V and G correspond to power supply voltages V1 and V2, and power supply voltages G1 and G2, respectively. More specifically, these correspond to the drain power supply voltage $V_{DD}$ and source power supply voltage $V_{SS}$ in a MOS transistor, for example.

Likewise in the domain D2, power supply voltages V2, G2, V2, G2, and V2 are assigned in this order from the uppermost power supply line WL3. This is because the domain D2 uses only power supply voltages V2 and G2. The power supply voltage V1, which has been assigned to the uppermost supply line WL3, is changed to a power supply voltage V2. The power supply voltage G1, which has been assigned to the second power supply line WL3 from the uppermost one, is changed to a power supply voltage G2.

Between the uppermost power supply line WL3 and the next lower power supply line WL3, there is disposed an active region AR1 consisting of well regions NW and PW arranged in this order from the top, as viewed in FIG. 13. Between the second and third power supply line WL3 from the uppermost one, there is disposed an active region AR2 consisting of well regions PW and NW arranged in this order from the top, as viewed in FIG. 13. The active regions AR1 and AR2 are disposed alternately. In FIG. 13, reference letters "n" and "p" indicate a region containing an n-type impurity and a region containing a p-type impurity, respectively.

Further, between adjacent domains D1 and D2, there are disposed plural alternate separation cells T1 and T2 for electrical separation between the domains D1 and D2. The area of these separation cells serves as the boundary between the domains D1 and D2.

The separation cell T1 consists of well regions PW and NW arranged in this order from the top, as viewed in FIG. 13. The separation cell T2 consists of well regions NW and PW arranged in this order from the top, as viewed in the figure. Each slanting line at the corners of the separation cells T1 and T2 in FIG. 13 is for convenience in indicating a difference in the array of well regions in the cells T1 and T2.

Referring to FIG. 13, the separation cell T1 is disposed so as to correspond to the active region AR1. Since the order of arrangement of well regions in the separation cell T1 is the reversal of that of the active region cell AR1, a pn junction performs electrical separation between the active regions AR1 of the domains D1 and D2.

The separation cell T2 is disposed so as to correspond to an active region AR2. Since the order of arrangement of well regions in the separation cell T2 is the reversal of that of the active region cell AR2, a pn junction performs electrical separation between the active regions AR2 of the domains D1 and D2.

By disposing the separation cells T1 and T2, each having no power supply lines, the power supply lines WL3 can be cut on the boundary between the domains D1 and D2.

Separation cells of more complicated structure are required for electrical separation on the boundary between a domain using clocks of different types (e.g., the domain D3 in FIG. 10) and a domain using a single clock (e.g., the domain D1 in FIG. 10).

Figure 14:
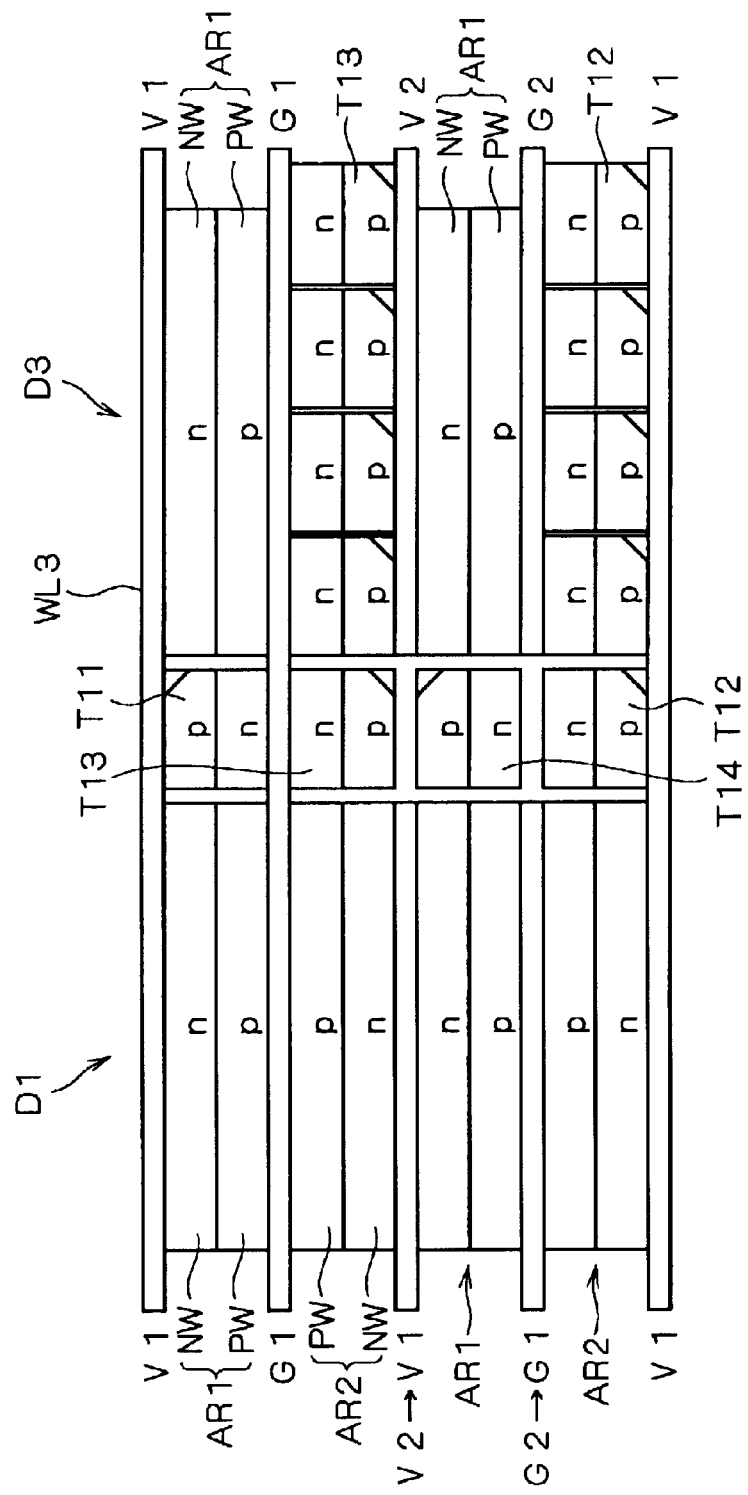

FIG. 14 is a plan view illustrating the electrical separation of domains D1 and D3 in gate array level. As viewed in FIG. 14, the gate array structure in the domain D1 is shown on the left side and that in the domain D2 is shown on the right side.

In the domains D1 and D3 in FIG. 14 wherein a plurality of power supply lines WL3 are disposed in parallel, region AR1 or AR2 that consists of a well region PW having a p-type impurity and a well region NW having an n-type impurity, is disposed between adjacent power supply lines WL3.

In the domain D1, power supply voltages V1, G1, V1, G1, and V1 are assigned in this order from the uppermost power supply line WL3. This is because the domain D1 uses only power supply voltages V1 and G1. The power supply voltage V2, which has been assigned to the third power supply line WL3 from the uppermost one, is changed to a power supply voltage V1. The power supply voltage G2, which has been assigned to the fourth power supply line WL3 from the uppermost one, is changed to a power supply voltage G1.

Between the uppermost power supply line WL3 and the next lower power supply line WL3, there is disposed an active region AR1 consisting of well regions NW and PW arranged in this order from the top, as viewed in FIG. 14. Between the second and third power supply line WL3 from the uppermost one, there is disposed an active region AR2 consisting of well regions PW and NW arranged in this order from the top, as viewed in FIG. 14. The active regions AR1 and AR2 are disposed alternately.

In the domain D3, power supply voltages V1, G1, V2, G2, and V1 are assigned in this order from the uppermost power supply line WL3. This is because the domain D3 uses power supply voltages V1, G1, and V2, G2.

The first, second, and fifth power supply lines WL3 in the domain D3 are electrically connected to the power supply lines WL3 in the domain D1.

Between the uppermost power supply line WL3 and the next lower power supply line WL3 in the domain D3, there is disposed an active region AR1 consisting of well regions NW and PW arranged in this order from the top, as viewed in FIG. 14.

Further, disposed between the adjacent domains D1 and D3 are separation cells T11, T12, T13, and T14 for electrical separation therebetween. The area of these separation cells serves as the boundary between the domains D1 and D3.

Specifically, plural separation cells T13 are interposed between the second and third power supply lines WL3 from the uppermost one, and plural separation cells T12 are interposed between the fourth and fifth power supply lines WL3.

The plan configuration of the separation cells T11 to T14 will be described with reference to FIGS. 15A to 15D.

Figure 15A:
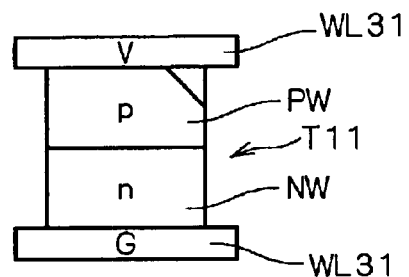
FIGS. 15A to 15D are diagrams illustrating separation cell configurations according to one preferred embodiment.

Referring to FIG. 15A, the separation cell T11 consists of well regions PW and NW arranged in this order from the top, as viewed in the figure. The well region PW has its outside a power supply line WL31 to which a power supply voltage V is assigned. The well region NW has its outside a power supply line WL31 to which a power supply voltage G is assigned. The separation cell T11 is hereinafter referred to as a "separation cell with VG", in some cases.

Figure 15B:
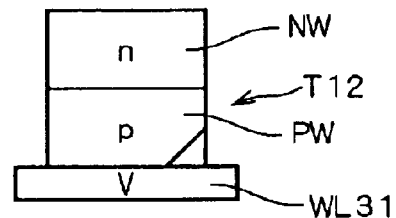

The separation cell T12 shown in FIG. 15B consists of well regions NW and PW arranged in this order from the top, as viewed in the figure. The well region PW has its outside a power supply line WL31 to which a power supply voltage V is assigned. The separation cell T12 is hereinafter referred to as a "separation cell with V", in some cases.

Figure 15C:
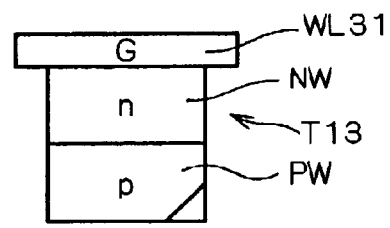

The separation cell T12 shown in FIG. 15C consists of well regions NW and PW arranged in this order from the top, as viewed in the figure. The well region NW has its outside a power supply line WL31 to which a power supply voltage G is assigned. The separation cell T13 is hereinafter referred to as a "separation cell with G", in some cases.

Figure 15D:
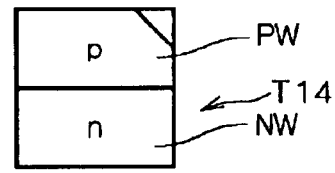

The separation cell T14 in FIG. 15D consists of well regions PW and NW arranged in this order from the top, as viewed in the figure. The separation cell T14 is hereinafter referred to as a "separation cell without VG", in some cases.

Each slanting line at the corners of the separation cells T11 to T14 in FIGS. 15A to 15D is for convenience in indicating a difference in the array of well regions in the cells T11 to T14.

Returning to FIG. 14, in the boundary between the domains D1 and D3, the separation cells T11, T13, T14, and T12 are arranged in this order from the top.

As described with reference to FIGS. 15A to 15D, the separation cell T11 has the power supply lines WL31 locating on the outside (actually, the outside and upward) of the well regions NW and PW. Therefore, by interposing the separation cell T11 between the uppermost active regions AR1 of the domains D1 and D3, all the active regions AR1 between the domains D1 and D3 can be electrically separated. In addition, by the presence of the power supply lines WL31, the uppermost power supply line WL3 and the next lower power supply line WL3 can substantially extend across the domains D1 and D3.

The separation cell T13 has the power supply line WL31 on the outside (actually, on the outside and upward) of the well region NW. Therefore, the active regions AR2 of the domain D1 can electrically be separated by disposing the separation cell T13 next to the second active region AR2 from the top in the domain D1.

By disposing continuously a plurality of separation cells T13 between the second and third power supply lines WL3 from the uppermost one, this second power supply line WL3 can extend substantially across the domains D1 and D3, by the presence of the power supply line WL31.

All the active regions between the domains D1 and D3 can be electrically separated by interposing the separation cell T14, having no power supply lines WL31, between the third active regions AR1 from the top in the domains D1 and D3.

The separation cell T12 has the power supply line WL31 on the outside (actually, on the outside and upward) of the well region PW. Therefore, the active regions AR2 of the domain D1 can electrically be separated by disposing the separation cell T12 next to the fourth active region AR2 from the top in the domain D1. In addition, by the presence of the power supply lines WL31, the fifth power supply line WL3 from the uppermost one can extend substantially across the domains D1 and D3.

By disposing continuously a plurality of separation cells T12 between the fourth and fifth power supply lines WL3 from the uppermost one, the fifth power supply line WL3 from the uppermost one can extend substantially across the domains D1 and D3, by the presence of the power supply line WL31.

7-2. Processing Flow of Electrical Separation of Active Regions

Referring to FIGS. 16 to 18, description will now be made of the processing flow of electrical separation of active regions as described above. In FIGS. 16 to 18, portions represented by the reference symbols ① and ② indicate that these portions are mutually in connection relationship.

First, in step S11 of FIG. 16, the boundary between domains is defined by referring to a floor plan.

Then, the power supply line of the lowermost layer that locates above the boundary between the domains is cut (step S12).

With respect to the power supply lines thus cut, assignment of power supply voltages is changed (step S13). Such change in the assignment is performed by the method of changing the assignment to the power supply lines WL1 and WL2, as described with reference to FIG. 10.

Subsequently, it is judged whether an active region sandwiched by the power supply lines of the lowermost layer is of type 1 or type 2 (step S14). As used herein, the term "type 1" means the above-mentioned active region AR1, that is, the active region where the power supply lines to which the power supply voltage V is assigned overlie the power supply lines to which the power supply voltage G is assigned. The term "type 2" means the above-mentioned active region AR2, that is, the active region where the power supply lines to which the power supply voltage G is assigned overlie the power supply lines to which the power supply voltage V is assigned.

When in step S14 it is judged that active region is of type 1, a separation cell used in electrical separation for type 1, for example, the separation cell T1 shown in FIG. 14, is prepared (step S15).

When in step S14 it is judged that active region is of type 2, a separation cell used in electrical separation for type 2, for example, the separation cell T2 shown in FIG. 14, is prepared (step S16). Note that FIG. 13 shows an example of separation using only the separation cells T1 and T2. Although arrangement can be completed through steps S11 to S16, in order to comply with the case shown in FIG. 14, however, it is required to execute the following steps.

Specifically, in step S17, it is judged whether a separation cell is located at the boundary or not. If located at the boundary, a separation cell is selected according to step S18 and later steps shown in FIG. 17. If not located at the boundary (i.e., when a separation cell is disposed between active regions that differ from one another in power supply voltage, in a domain using clocks of different types and requiring power supply voltages of different types), the separation cell is selected according to step S26 and later steps shown in FIG. 18.

That is, when the separation cell is located at the boundary, it goes to step S18 in FIG. 17. If judged that in the active regions to be compared in two domains sandwiching the boundary, one power supply line to which a power supply voltage V is assigned and the other to which a power supply voltage G is assigned, these power supply lines sandwiching the active regions, are in correspondence (i.e., the power supply voltages V and G are in correspondence); and that in the two domains, no change is made in the assignment of power supply voltages to these power supply lines (i.e., no change in the power supply voltages V and G), the separation cell T11 (separation cell with VG), shown in FIG. 15A, is disposed at the boundary between the two active regions to be compared (step S19). This processing corresponds to the disposal of the separation cell T11, shown in FIG. 14.

In step S20, if judged that in the active regions to be compared in two domains sandwiching the boundary, one power supply line to which a power supply voltage V is assigned and the other to which a power supply voltage G is assigned, these power supply lines sandwiching the active regions, are in correspondence (i.e., the power supply voltages V and G are in correspondence); and that in either of the two domains, the assignment of power supply voltages to these supply lines is changed (i.e., both the power supply voltages V and G are changed), the separation cell T14 (separation cell without VG), shown in FIG. 15D, is disposed at the boundary between the two active regions to be compared (step S21). This processing corresponds to the disposal of the separation cell T14, shown in FIG. 14.

In step S22, if judged that in the active regions to be compared in two domains sandwiching the boundary, one power supply line to which a power supply voltage V is assigned and the other to which a power supply voltage G is assigned, these power supply lines sandwiching the active regions, are not in correspondence (i.e., the power supply voltages V and G are not in correspondence); and that in either of the two domains, there is a change in the assignment to the power supply line to which the power supply voltage V is assigned (i.e., only the power supply voltage V is changed), the separation cell T13 (separation cell with G), shown in FIG. 15C, is disposed at the boundary between the two active regions to be compared (step S23). This processing corresponds to the disposal of the separation cell T13, shown in FIG. 14.

In step S24, if judged that in active regions to be compared in two domains sandwiching the boundary, one power supply line to which a power supply voltage V is assigned and the other to which a power supply voltage G is assigned, these power supply lines sandwiching the active regions, are not in correspondence (i.e., the power supply voltages V and G are not in correspondence); and that in either of the two domains, there is a change in the assignment to the power supply line to which the power supply voltage G is assigned (i.e., only the power supply voltage G is changed), the separation cell T12 (separation cell with V), shown in FIG. 15B, is disposed at the boundary between the two active regions to be compared (step S25). This processing corresponds to the disposal of the separation cell T12, shown in FIG. 14.

In the foregoing description, the expression that "the power supply voltages V and G are in correspondence" means, for example, the state that a power supply voltage V1 is assigned to one power supply line and a power supply voltage G1 is assigned to the other. The expression that "the power supply voltages V and G are not in correspondence" means, for example, the state that a power supply voltage G1 is assigned to one power supply line and a power supply voltage V2 is assigned to the other.

On the other hand, when a separation cell is not located at the boundary, that is, when the separation cell is used for electrical separation between active regions within the domain, judgment is made in step S26 of FIG. 18. If judged that one power supply line to which a power supply voltage V is assigned and the other to which a power supply voltage G is assigned, these power supply lines sandwiching active regions to be processed, are in correspondence (i.e., the power supply voltages V and G are in correspondence), a normal gate array is disposed in the active regions (step S27).

In step S28, if judged that one power supply line to which a power supply voltage V is assigned and the other to which a power supply voltage G is assigned, these power supply lines sandwiching the active regions to be processed, are not in correspondence (i.e., the power supply voltages V and G are not in correspondence); and that there is a change in the assignment to the power supply line to which the power supply voltage V is assigned (i.e., only the power supply voltage V is changed), the separation cell T13 (separation cell with G), shown in FIG. 15C, is disposed in place of the active regions to be processed (step S29). This processing corresponds to the continuous disposal of the separation cell T13, shown in FIG. 14.

In step S30, if judged that one power supply line to which a power supply voltage V is assigned and the other to which a power supply voltage G is assigned, these power supply lines sandwiching the active regions to be processed, are not in correspondence (i.e., the power supply voltages V and G are not in correspondence); and that there is a change in the assignment to the power supply line to which the power supply voltage G is assigned (i.e., only the power supply voltage G is changed), the separation cell T12 (separation cell with V), shown in FIG. 15B, is disposed in place of the active regions to be processed (step S31). This processing corresponds to the continuous disposal of the separation cell T12, shown in FIG. 14.

Execution of the foregoing steps S11 to S31 achieves electrical separation between the domain D3 using clocks of different types and the domain D1 using a single clock, as shown in FIG. 14, and also achieves electrical separation between the active regions in the domain D3.

While the invention has been shown and described in detail, the foregoing description is in all aspects illustrative and not restrictive. It is therefore understood that numerous modifications and variations can be devised without departing from the scope of the invention.

What is claimed is:

1. A method of designing a semiconductor device in which plural clocks having different frequencies are applied to a logic region, comprising the steps of:

(a) dividing said logic region by the region of a logic operating with a specific clock, to obtain plural domains;

(b) disposing-plural power supply bumps in a matrix manner in said logic region and, based on a predetermined first rule, uniquely assigning plural power supply voltages of different types that correspond to said clocks respectively, to said power supply bumps;

(c) disposing plural first power supply lines in parallel in a first layer and, based on a predetermined second rule, uniquely assigning said power supply voltages to said first power supply lines;

(d) disposing plural second power supply lines in parallel in a second layer different from said first layer, such that said second power supply lines are orthogonal to said first power supply lines when viewed from above and, based on a predetermined third rule, uniquely assigning said power supply voltages to said second power supply lines; and (e) classifying said power supply voltages into a power supply voltage used in each of said plural domains and changing, based on said classification, said power supply voltages uniquely assigned to said power supply bumps and said first and second power supply lines, one by one of said plural domains.

2. The method according to claim 1, wherein said first rule in said step (b) is to obtain repetitiveness by assigning successively said plural power supply voltages of different types in a first array direction of said power supply bumps.

3. The method according to claim 2, wherein in said step (c),
there is included the step of disposing said first power supply lines so as to be parallel to a row of said power supply bumps in said first array direction, and
said second rule is to assign alternately said plural power supply voltages successively from two of said first power supply lines that are nearest neighbors to opposite sides of said row of said power supply bumps.

4. The method according to claim 3, wherein said first power supply lines are electrically connected to said power supply bumps, and
said first rule includes disposing said first power supply line that applies said power supply voltage corresponding to a domain using the highest frequency clock in said plural clocks of different types, in the most proximity to said row of said power supply bumps in said first array direction.

5. The method according to claim 3, wherein
said first power supply lines are electrically connected to said power supply bumps, and
said first rule includes disposing said first power supply line that applies said power supply voltage corresponding to a domain having the largest logic scale among said plural clocks of different types, in the most proximity to said row of said power supply bumps in said first array direction.

6. The method according to claim 2, wherein in said step (d),
there is included the step of arranging said second power supply lines so as to be parallel to a row of said power supply bumps in a second array direction orthogonal to said first array direction, and
said third rule is to obtain repetitiveness by assigning successively said plural power supply voltages in the direction of arrangement of said second power supply lines.

7. The method according to claim 1, wherein said step (e) includes the steps of:
cutting and dividing said first and second power supply lines when they are power supply lines disposed so as to extend across said plural domains and said power supply voltages assigned to said power supply lines are not common to power supply voltages used in said plural domains, above the boundary portion of said domains so as to locate only on the corresponding domain; and
changing, after dividing said first and second power supply lines, said power supply voltages uniquely assigned to said power supply lines so as to have a value suitable for the corresponding domain, based on said classification.

8. The method according to claim 1, wherein said step (e) is performed by regarding, as a single domain, a certain domain in which at least two or more of said plural clocks of different types are used as said specific clock.

9. The method according to claim 1, wherein
said logic region is configured with plural active regions on which a gate array is formed, and
said active regions are disposed so as to be sandwiched when viewed from above, by plural third power supply lines arranged in parallel to each other to the lowermost layer,
said method further comprising the steps of:
(f) interposing a separation cell for electrical separation between said active regions in which said plural domains are adjacent to each other in said plural domains, to obtain a domain boundary portion; and
(g) cutting and dividing said third power supply lines above said domain boundary portion when said third power supply lines are power supply lines disposed so as to extend across said adjacent domains and said power supply voltages assigned thereto are not common to power supply voltages used in said adjacent domains.

10. The method according to claim 9, wherein,
said active regions have first and second impurity regions of different conductivity types,
said first and second impurity regions are disposed adjacent to each other such that said first and second impurity regions are parallel in the direction in which said third power supply lines extend, and
said step (f) includes the step of preparing, as said separation cell, such a configuration that third and fourth impurity regions of different conductivity types are adjacent to each other and arranged in an inverted order from that in said first and second impurity regions of said active regions.

11. The method according to claim 9, further comprising the step of:
(h) electrically separating a domain using at least two more of said plural clocks of different types, by surrounding said active regions with said separation cell.

12. A semiconductor device comprising:
plural power supply bumps arranged in a matrix manner in a logic region;
plural first power supply lines that are disposed in parallel to each other to a first layer and are electrically connected to said power supply bumps; and
plural second power supply lines that are disposed in parallel to each other so as to be orthogonal to said first power supply lines when viewed from above, in a second layer different from said first layer, and are electrically connected to said first power supply lines, wherein
each of said power supply bumps is electrically connected to said first power supply lines via a respective relay conductor layer disposed in a layer underlying said first layer.

13. The semiconductor device according to claim 12, wherein
plural clocks having different frequencies are applied to said logic region,
said logic region is divided into plural domains by the region of a logic operating with a specific clock, and
said first and second power supply lines includes second power supply lines cut and divided on the boundary portion of said plural domains.

* * * * *